(12) United States Patent
Sawaguchi

(10) Patent No.: US 7,865,799 B2
(45) Date of Patent: *Jan. 4, 2011

(54) RECORDING FORMAT FOR INFORMATION DATE, INFORMATION RECORDING/REPRODUCING CORDING CIRCUIT

(75) Inventor: Hideki Sawaguchi, Kokubunji (JP)

(73) Assignee: Hitachi Global Storage Technologies Japan, Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/194,455

(22) Filed: Aug. 19, 2008

(65) Prior Publication Data

US 2008/0313524 A1    Dec. 18, 2008

Related U.S. Application Data

(63) Continuation of application No. 10/651,998, filed on Sep. 2, 2003, now Pat. No. 7,526,710.

(30) Foreign Application Priority Data

Mar. 20, 2003    (JP) .............................. 2003-078426

(51) Int. Cl.
    *H03M 13/00*    (2006.01)
(52) U.S. Cl. ...................... 714/755; 714/758; 714/784; 714/786
(58) Field of Classification Search .................. 714/755, 714/758, 784, 786
    See application file for complete search history.

(56) References Cited

U.S. PATENT DOCUMENTS 5,875,199 A    2/1999    Luthi 6,490,243 B1 *  12/2002  Tanaka et al. ............... 370/216
6,574,766 B2 *  6/2003   Obuchi et al. ............... 714/755
6,631,485 B1    10/2003  Morley et al.

(Continued)

FOREIGN PATENT DOCUMENTS

JP    2000-196469    7/2000

(Continued)

OTHER PUBLICATIONS

Japanese Office Action dated Jul. 22, 2008, issued in corresponding Japanese Patent Application No. 2003-078426.

(Continued)

*Primary Examiner*—Esaw T Abraham
(74) *Attorney, Agent, or Firm*—Antonelli, Terry, Stout & Kraus, LLP.

(57) ABSTRACT

An efficient encoding method for error correction coding for recording/reproducing information in a high-density magnetic recording/reproduction apparatus. Based upon the principle of Turbo coding for random error-correction a practical encoding method is provided for preventing the propagation of code errors from being caused by the failure of the error correction due to burst signal errors existing on actual reproduced signal and recovering reliable code data from this. An information code sequence is divided in units of code block and the random error-correction coding is applied to an individual code block. Concatenated coding with hard-decision error-correction code for compensating a burst error is subsequently applied. This allows the encoding method to reduce the decoding time delay, or latency, in iterative decoding for the error-correction thereby achieving high-speed error correction.

3 Claims, 14 Drawing Sheets

U.S. PATENT DOCUMENTS

| | | | |
|---|---|---|---|
| 6,718,505 | B1 | 4/2004 | Kravtchenko et al. |
| 6,798,593 | B2 | 9/2004 | Hattori et al. |
| 7,035,342 | B2 * | 4/2006 | Cameron et al. ............ 375/265 |
| 7,234,096 | B2 * | 6/2007 | Yamada ...................... 714/755 |
| 7,369,746 | B2 | 5/2008 | Ueda et al. |
| 7,421,034 | B2 * | 9/2008 | Cameron et al. ............ 375/265 |
| 2002/0051499 | A1 | 5/2002 | Cameron et al. |

FOREIGN PATENT DOCUMENTS

| | | |
|---|---|---|
| JP | 2001-285080 | 10/2001 |
| JP | 2002-353821 | 12/2002 |
| JP | 2003-006993 | 1/2003 |
| JP | 2004-193727 | 7/2004 |

OTHER PUBLICATIONS

IEEE Transactions on Communications, vol. 48, No. 8, Aug. 2000, p. 1297-1308.

IEEE Transactions on Magnetics, vol. 36, No. 5, Sep. 2000, p. 2173-2175.

Japanese Office Action dated Apr. 22, 2008, issued in corresponding Japanese Patent Application No. 2003-078426.

Sawaguchi, H., et al., Interactive Decoding for Concatenated Error Correction Coding in PRML Channel Systems, Proc. IEEE GLOBECOM' 99, Dec. 1999, vol. 1B, p. 749-754.

IEEE Journal on Selected Areas in Communicatoins, A PRML System for Digital Magnetic Recording, vol. 10, No. 1, Jan. 1992, p. 38-56.

IEEE Proceedings of International Conference on Communications, Near Shannon Limit Error-Correcting Coding and Decoding: Turbo-codes, May 1993, p. 1064-1070.

Berrou, Claude et at., "Near Shannon Limit Error-Correcting Coding and Decoding: Turbo-codes" (IEEE Proceedings of International Conference on Communications, pp. 1064-1070, May 1993).

Cideciyan, Roy D. at al., "A PRML System for Digital Magnetic Recording" (IEEE Journal of Selected Areas in Communications, vol. 10, pp. 38-56, Jan. 1992).

* cited by examiner

US 7,865,799 B2

RECORDING FORMAT FOR INFORMATION DATE, INFORMATION RECORDING/REPRODUCING CORDING CIRCUIT

CROSS REFERENCE TO RELATED APPLICATION

This application is a Continuation of U.S. application Ser. No. 10/651,998, filed Sep. 2, 2003, now U.S. Pat. No. 7,526,710, which claims priority from JP 2003-078426, filed Mar. 20, 2003, the contents of which are incorporated herein by reference.

BACKGROUND OF THE INVENTION

1. Field of the Invention

The present invention relates to a recording format for information data, an information recording/reproducing coding method, an information recording/reproducing encoding circuit, a magnetic recording/reproducing apparatus using these, an information recording/reproducing apparatus and an information communication device respectively for recording/reproducing an information data code at high speed and at high reliability in a high-density mass-storage information recording/reproducing apparatus by magnetic recording and optical recording medium.

2. Description of the Related Art

To realize information recording system at high speed and at high recording density, signal processing technique for faithfully reproducing information recorded on a recording medium plays an important role. Above all, in a mass-storage memory device represented by a high-density magnetic recording/reproducing apparatus, not only to secure the reliability of data recorded for a long term but to prevent various noise disturbance caused by high-density recording and the quality deterioration of recorded/reproduced signal caused by the minuteness of a recorded element due to high-density recording and realize lower-cost and high-density information recording apparatus, higher-precision data conversion technique from a recorded/reproduced signal to information data is desired.

For signal processing technique developed as technique for solving the above-mentioned technical problems and currently applied to magnetic disk products widely, there is a PRML technique in which a partial-response equalization method and a maximum-likelihood decoding method are combined, for example, a method of embodiment is disclosed in detail in a nonpatent reference document 1, "A PRML System for Digital Magnetic Recording" (IEEE Journal of Selected Areas on Communications, vol. 10, pp. 38 to 56, Jan. 1992) and demodulation from a reproduced signal to data at lower signal-to-noise (SN) ratio is enabled by disclosed technique, relieving the problem of intersymbol interference caused by high-density recording.

In the meantime, for a method to keep the data reliability in a general memory device, means for correcting code errors caused in reproduced data by using error-correction coding technique is widely known and a coding method based upon classical algebraic code system, above all, error-correction coding technique such as Reed-Solomon code is most widely applied to a mass-storage recording device. The Reed-Solomon code can correct the predetermined number of code errors caused in a reproduced code sequence in units of code symbol of predetermined bit length by adding a redundant code symbol for checking the code errors into a recorded code sequence beforehand.

Generally, in case the code symbol unit has n-bit length, a code sequence composed of maximum $2^{(n-1)}$ symbols can be formed and arbitrary t pieces of error symbols in the code sequence can be corrected by adding 2t pieces of redundant code symbols. As described above, as guaranty for error correction for a reproduced code sequence can be easily defined using a Reed-Solomon code that can set maximum correction capability in units of symbol maximum number of correctable error symbol and powerful error-correction processing in which an arbitrary code error event within the maximum number of corrected symbols can be corrected can be realized, the Reed-Solomon code is widely applied to a recording device and for general technique for guaranteeing the reliability of data, the Reed-Solomon code greatly contributes to high-density information recording.

However, to realize further higher-density recording, the increase of code error allowable capability by the enhancement of error-correction coding technique is required. To enhance the error-correction capability, a method of increasing the number of redundant code symbols is easy, however, in the meantime, in information recording, as the increase of redundant code symbols requires the further increase of effective recording density, the method itself is in a limited use.

For another method of enhancing the capability of error-correction coding without increasing redundant code symbols, there is an error-correction decoding method using soft-output information and for new coding technique in which maximum-likelihood decoding by soft-output iterative decoding is executed corresponding to error-correction coding, recently the application of error-correction technique by Turbo coding has been introduced mainly to a data communication field. The Turbo coding technique was proposed by C. Berrou and others in 1993 and is disclosed in a nonpatent reference document 2, "Near Shannon Limit Error-Correcting Coding and Decoding: Turbo-codes" (IEEE Proceedings of International Conference on Communications, pp. 1064 to 1070, May 1993) for example.

The Turbo coding technique executes a concatenated coding that plural code sequences acquired by permuting (interleaving) the same information code sequence at random are generated, simple error-correction coding to generate is applied to each of the plural code sequences and the plural redundant codes are added to the information code sequence. Besides, in decoding, the technique executes an iterative technique that soft-output decoding is individually executed using each of the plural redundant codes for error-correction coding, when one soft-output decoding is executed, the result of maximum-likelihood code sequences for the whole code sequence can be gradually acquired by executing iterative decoding utilizing the results of the other soft-output decoding as the prior information of each code. As described above, the Turbo coding technique is provided with means for realizing optimum decoding for random coding and is technique highlighted as a method of coding and decoding for transmission for realizing a coding gain close to Shannon limit bound on realistic circuit scale. Similarly, a random code error caused in a reproduced code sequence can be powerfully corrected by applying the technique to a recording/reproduction system of an information recording apparatus and it can be expected that a gain limit of near optimum by the addition of code redundancy is achieved on realistic hardware scale and at realistic speed.

However, in an actual magnetic recording/reproducing apparatus, as a defect which may exist on a magnetic recording medium and a continuous bursty signal defect caused by the accidental touch of a magnetic head/medium system exist in addition to a random code error caused by noise, means for efficiently improving both factors of code errors by both is required. In such signal environment, in the above-mentioned Turbo coding technique, the above-mentioned principle effectively acts on the former random code error and extremely high code correcting capability can be fulfilled, however, in the meantime, for the latter burst defect, as the soft-output information of an individual code cannot be suitably generated, the proper correcting capability cannot be fulfilled. Or a code error cannot be also extremely rarely corrected for the superimposition of specific random noise and in these cases, a code error is finally diffused (propagated) and increased in the whole code sequence due to the random permutation (interleave) of an information code sequence.

Besides, in a patent document 1 (Japanese published unexamined patent application No. 2001-285080), a decoder that detects loss in decoding using a convolutional interleaver is disclosed, however, means for solving the above-mentioned problems is not provided.

In such a situation of the prior art, even if error-correction means based upon the Reed-Solomon code is added, the recovery of data cannot be guaranteed and it is extremely difficult to apply the Turbo coding principle in configuration heretofore disclosed to a mass-storage recording/reproduction device for which reliable data integrity is required. Besides, in coding/decoding means by hard-decision algebraic means such as the Reed-Solomon code, the correctable number of correctable code errors is disclosed beforehand and code design is enabled, however, in Turbo coding, as error detection/correction are executed based upon soft-output information, the correctable number of code errors cannot be disclosed. This makes the reliable design of a data recording/reproduction device for enhancing high recording density and high-speed data transfer rate in the prior art extremely difficult and makes the application of Turbo coding to the device more difficult.

[Nonpatent Document 1]
"A PRML System for Digital Magnetic Recording" (IEEE Journal of Selected Areas on Communications, vol. 10, pp. 38 to 56, Jan. 1992)

[Nonpatent Document 2]
"Near Shannon Limit Error-Correcting Coding and Decoding: Turbo-codes" (IEEE Proceedings of International Conference on Communications, pp. 1064 to 1070, May 1993)

[Patent Document 1]
Japanese published unexamined patent application No. 2001-285080

BRIEF SUMMARY OF THE INVENTION

The object of the invention is to apply the above-mentioned principle of Turbo coding to a high-density high-speed information recording/reproduction system represented by a magnetic recording/reproduction apparatus, to enhance error-correction ability in recording/reproduction and to realize the further enhancement of the high recording density and high-speed data transfer rate of information recording.

The invention is made to solve the realistic problems in applying the principle of Turbo coding to the high-density high-speed information recording/reproduction apparatus. That is, one object of the invention is to enhance correction capability for the above-mentioned two code error modes existing in real recording/reproduction apparatus by solving the problem of code error propagation due to the failure of error correction in Turbo coding and in addition, providing error correction coding system configuration in which correction capability for a burst error mixed in a random error can be guaranteed. The further problem the invention is to solve is the deterioration of the latency of data decoding by iterative processing in decoding. A decoding principle in Turbo coding in which decoding is repeated for a code sequence including operation for permuting the whole information code sequence causes decoding time delay equivalent to a few times of the information code sequence. Such a problem is a very significant problem to realize high-speed data transmission in a recording/reproduction apparatus.

The object of the invention is to solve the above-mentioned decoding latency problems and to provide a recording format for information data, information recording coding method and circuit, a magnetic recording/reproduction apparatus using them, an information recording/reproduction apparatus and an information communication device respectively provided with more powerful and high-speed error-correction coding means applying the principle of Turbo coding.

To achieve the above-mentioned objects, the invention is based upon a magnetic recording/reproduction apparatus and is characterized in that a recording format for recording information data on a recording medium includes a preamble including additional information for the control of recording positional information, signal amplitude gain control and data timing recovery, an information code composed of code blocks including a second redundant code bit (a second parity code bit) and a common-length redundant code composed of code blocks including a first redundant code bit (a first parity code bit) and the length of each code block including the redundant code bit of the second redundant code is equal to the length of a code symbol (unit) correctable by the first redundant code bit or shorter.

Besides, the invention is based upon an information recording/reproducing coding method for recording an information code sequence to which error-correction coding for detecting and correcting a code error caused in the information code sequence reproduced from an information recording medium is applied on the information recording medium, and is characterized in that error correction in units of predetermined code (code symbol) is applied to a unit (an information data sector) of an information code sequence once recorded on the information recording medium, first error-correction coding for correcting error code symbols caused in the corresponding reproduced information data sector up to a predetermined number of correctable error code symbols is applied, a redundant code sequence by the first error-correction coding is added into the corresponding information data sector, the information data sector to which the first error-correction coding is applied is divided into consecutive plural code sequence blocks with a predetermined code symbol length, second error-correction coding is applied to each code sequence block, a redundant code by the second error-correction coding this is inserted into the corresponding code sequence block, the code sequence block to which the second error-correction coding is applied has code sequence block length in units of code symbol in the first error-correction coding and an information code sequence to which error-correction coding is applied and which has the code sequence block length equal to or shorter than the number of code symbols correctable by the first error-correction coding is recorded on the information recording medium.

Further, the invention is based upon an information recording/reproducing encoding circuit provided with an error-correction encoding circuit for detecting and correcting code errors caused in the information code sequence recorded onto the information recording medium when the information code sequence is reproduced from an information recording medium and is characterized in that error correction in a predetermined code unit (code symbol) is executed in a unit (an information data sector) of information code sequences once recorded on the information recording medium, an encoding circuit for executing first error-correction coding for correcting error code symbols caused in the reproduced information data sector up to a predetermined number of correctable error code symbols is provided, a redundant code sequence by the first error-correction coding is added to the information data sector output by this, a circuit for dividing the code contents of an information data sector code sequence output from the encoding circuit for executing the first error-correction coding into consecutive plural code sequence blocks with a predetermined code symbol length and holding each code sequence block is provided, an encoding circuit for executing second error-correction coding, referring to the code contents of each code sequence block and an error-correction encoding circuit having code sequence block length to which the second error-correction coding is applied in units of code symbol in the first error-correction coding and which is equal to or shorter than the number of code symbols correctable by the first error-correction coding for outputting a series of code sequence blocks as a code sequence recorded on the information recording medium after a redundant code output from each second encoding circuit is inserted into the corresponding code sequence block are provided, wherein the code sequence block has a code length to which the second error-correction coding is applied in units of code symbol in the first error-correction coding and which is equal to or shorter than the number of code symbols correctable by the first error correction coding, and a code sequence for recording on the information recording medium to which an information code sequence is converted by the error-correction encoding circuit is output.

Furthermore, the invention is characterized in that the above-mentioned circuit is mounted in a magnetic recording/reproduction apparatus, an information recording/reproduction apparatus and an information communication device.

DETAILED DESCRIPTION OF THE PREFERRED EMBODIMENTS

Figure 1:
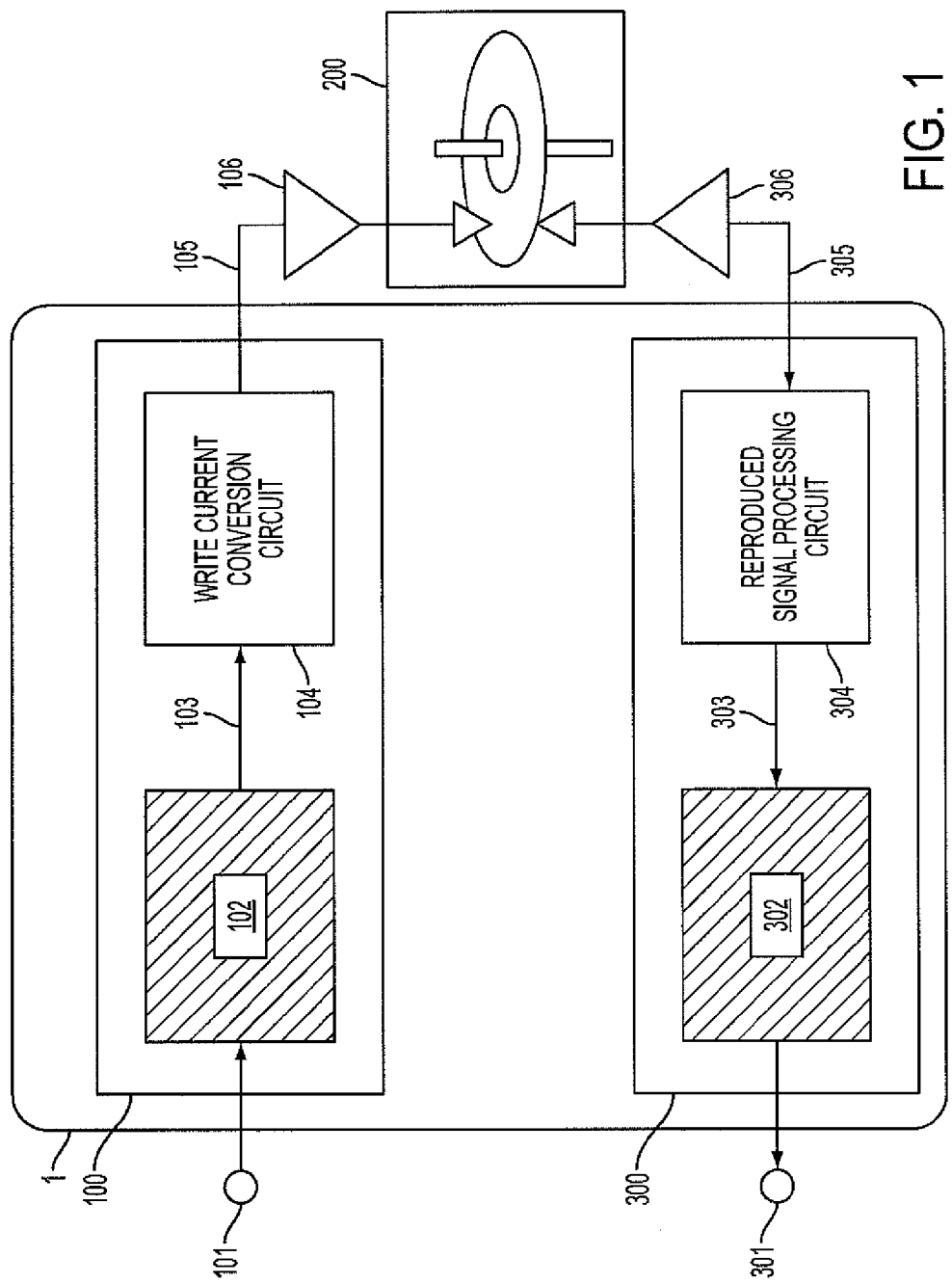
FIG. 1 shows an example of the whole configuration of an information recording/reproduction system according to the invention.

First, the outline of an information recording/reproduction encoding method according to the invention will be described. In the information recording/reproduction encoding method according to the invention, coding for effectively correcting both of a random code error and a burst error is executed by concatenating by a Turbo coding configuration and a hard-decision Reed-Solomon code configuration. Further, in the invention, first error-correction coding that burst errors with a predetermined maximum length in the whole information data sector (in units of recorded/reproduced code information symbol) are corrected by a hard-decision Reed-Solomon code based upon predetermined redundancy and concatenated coding (second error-correction coding) that the whole information data sector is divided into plural code blocks and Turbo coding is applied to each code block are executed. As described above, when Turbo coding is applied to a divided block, a code error can be limited to a range of a code block even if the bursty propagation of the code error is caused by the failure of the code error correction based upon soft-output information in Turbo decoding. Therefore, an event of the propagation of the code error by Turbo coding can be securely recovered by limiting the size of the code block within the maximum correctable error number of a burst (first) error-correction code added in the corresponding sector. Besides, the decoding delay of soft-output iterative decoding applied to each code block can be reduced by applying Turbo coding to a shorter code block divided in plurality.

In error correction by the above-mentioned coding, in case the correction by the first error-correction coding for a burst error fails, securer data reproduction is enabled by feedbacking already acquired soft-output coding information to acquire further powerful error-correction effect and newly generating soft-output information based upon a reproduced signal. As a result of soft-output decoding by the second error-correction coding, the likely code information of most of codes dispersed in the whole sector is acquired, and the generation of higher-reliable soft-output information and the reduction of code errors are enabled by utilizing the likely code information together with newly input reproduced signal information and using it as prior code information because the effect of burst error distortion is small owing to dispersion in the whole wider sector. Such iterative decoding in units of sector excessively increases decoding delay time, however, as the rereading of data (retry operation) is performed as in the invention only in case error correction by the first error-correction coding is impossible, the effective data reading time (data latency) of a storage device can be remarkably reduced by iterative processing.

An encoding circuit using the above-mentioned error-correction coding method and decoding method is provided with means that can set the individual frequency (iteration) number and the maximum frequency (iteration) number of iterative decoding and has the following characteristics.

(1) When signal amplitude loss (dropout) of predetermined code length is added to a reproduced signal sequence supplied from a recording medium and a continuous error is caused in an information code sequence or when a set iterative frequency is increased, time since the reproduced signal sequence is input until the result of the decoding of an information code sequence for the reproduced signal sequence is output increases.

(2) In case signal amplitude loss (dropout) of predetermined code length is added to the reproduced signal sequence supplied from the recording medium and the continuous error is caused, the predetermined code length exceeds a certain value equal to or shorter than code sequence block length when the detection and the correction of a code error by the first error-correction coding are impossible, a code error caused as the result of the decoding of the information code sequence is longer than the length of the signal amplitude loss (dropout) and is limited to length equal to or shorter than the code sequence block length.

(3) The encoding circuit is characterized in that in the detection and the correction of a code error by the first error-correction coding, when a flag showing that an error-correction code is impossible is transmitted or when a retry mode is used, time since the reproduced signal sequence is input until the result of the decoding of the information code sequence for the reproduced signal sequence is output increases. The increase of the time varies in units of the length of time in which the contents of codes in the corresponding information data sector are output or shorter. It is validated based upon such characteristics that code error-correction means by the above-mentioned encoding means is provided. Referring to the drawings, embodiments of the invention will be described in detail below.

First Embodiment

FIG. 1 shows an example of the whole configuration of an information recording/reproducing system for embodying the invention. The invention is embodied in a recording/reproducing signal processing circuit 1 for recording/reproducing an information code on a head/recording medium system 200 in a high-density mass-storage magnetic recording/reproducing apparatus (a magnetic disk unit) at high reliability. The invention can be applied not only to the magnetic disk unit but to a high-density mass-storage recording/reproducing apparatus using magnetic recording/optical recording/photomagnetic recording. The recording/reproducing signal processing circuit 1 shown in FIG. 1 is generally realized in the configuration of a large-scale semiconductor integrated (LSI) circuit device, and its basic function is composed of two processes of a recording system 100 that converts recording code information 101 to write current 105 and supplies it to the head/recording medium system 200 and a reproduction system 300 for converting a reproduced signal 305 from the head/recording medium system 200 to reproduced code information 301. The invention is characterized in that a recording/reproducing method including a practical information recording/reproducing coding method based upon Turbo coding principle is provided to a method of converting the recording code information 101 in the recording system 100 and a method of converting to the reproduced code information 301 in the reproduction system 300 to reduce as many code errors as possible in reproducing information in the reproduction system 300 and to demodulate the reproduced code information 301 at higher reliability. The invention is also characterized in that the invention realizes circuit means having concrete configuration including an information recording/reproducing encoding circuit for realizing the recording/reproducing method for the recording/reproducing signal processing circuit 1 and also realizes a magnetic disk recording/reproducing apparatus using this circuit, further an information recording/reproducing apparatus and an information communication device.

In the recording system 100, an information code sequence 101 transmitted from a computer or a host controller of periphery equipment is input and after it is converted to a recording code sequence 103 in an encoder (an encoding circuit) 102, the recording code sequence is converted to a desired write current sequence 105 in a write current conversion circuit 104. In the write current conversion circuit 104, the control in which a recording process in the head/recording medium system 200 succeeding the write current conversion circuit 104 is supposed of a write current level and the compensation of the phase at a point at which a suitable current level varies are performed and the write current sequence 105 output from the write current conversion circuit is supplied to a recording head in the head/recording medium system 200 via a write amplifier 106, and code information corresponding to the code information sequence 101 is physically recorded in a desired position on a magnetic disk recording medium (on an optical disk recording medium in the case of another information recording/reproducing apparatus, for example, in the case of an optical disk recording/reproducing apparatus) via the recording head. The recorded code information is read from a desired recorded location at desired time by a reproducing head according to an instruction from the host controller and is output as a reproduced signal sequence 305 which is an electric signal (the variation of voltage) via a read amplifier 306.

In the reproduction system 300, the reproduced signal sequence 305 is input via the read amplifier (amplifying circuit) 306 and predetermined reproduced signal processing such as adjusting the amplitude of read voltage, filtering for removing noise, conversion from an analog signal to a digital signal and shaping (equalizing) the waveform of a reproduced signal is applied to the reproduced signal sequence in a reproduced signal processing circuit 304. Particularly in the current high-density recording magnetic disk unit, a principle of reproduced signal processing called partial response maximum likelihood (PRML) is generally used and this embodiment is also based upon the data reproducing method.

The details of this method are disclosed in the nonpatent reference document 1 for example. Generally, in PRML, an input analog reproduced signal is controlled so that it is at a desired signal level and after the signal is converted to a digitized and quantized digital signal at the time interval of an information code bit, partial response equalization processing (intersymbol interference control) by a digital filter and the detection of reproduced code information by a maximum-likelihood decoder (a decoding circuit) are performed. In this embodiment, a signal process for generating a decoded signal sequence 303 (generally, a digital signal sequence) which is an output for partial response equalization from the input of the analog reproduced signal immediately before the detection of reproduced code information is executed in the reproduced signal processing circuit 304.

Further, in the reproduction system 300, the decoded signal sequence 303 output from the reproduced signal processing circuit 304 is converted to a reproduced code sequence 301 corresponding to an original information code sequence 101 via a decoder (a decoding circuit) 302. At this time, in the decoder (the decoding circuit) 302, data soft-output decoding by the maximum-likelihood decoder and error detecting/correcting decoding utilizing error detecting/correcting coding proper to the invention executed in the encoder 102 are executed.

The error detecting/correcting coding and the error detecting/correcting decoding will be described in detail in embodiments succeeding an embodiment shown in FIG. 2. As described above, the flow of processing in the recording system 100 is equivalent to the reverse flow of processing in the reproduction system 300, and the encoder 102 and the decoder 302 and the recording signal processing circuit 104 and the reproduced signal processing circuit 304 are functionally relative. A series of flow from the information code sequence 101 to the reproduced code sequence 301 can completely correspond to a series of flow of processing in a data communication system and the basic flow in the invention can be also applied to the communication system, that is, an information communication device by replacing the head/recording medium system 200 with an information transmission system.

In the invention, a method of realizing conversion and reconstitution from the information code sequence 101 to the reproduced code sequence 301 at higher precision and reliability and compensating the data deterioration due to various disturbance in the head/recording medium system 200 of the signal quality of the reproduced signal sequence 305 from the recording medium and the prevention of the faithful recording/reproduction (transmission) of information or a method of recording information on the medium at higher density (transmitting data at high speed) and a circuit embodying this are realized. To embody this, in the invention, for a circuit for embodying a method of more mightily detecting/correcting a code error caused in the reproduced code sequence 301, a code error detecting/correcting circuit based upon Turbo coding/decoding principle is provided in the encoder 102 and the decoder 302.

Turbo coding/decoding is known as a coding method showing performance near to Shannon limit bound for the capacity of a channel which is the theoretical limit of coding performance, and the principle and the configuration of coding/decoding by a parallel concatenated convolutional code are disclosed in the nonpatent document 2 ("Near Shannon limit error correcting coding and decoding": Turbo codes (I), in Proc. ICC'93, May 1993, pp. 1064 to 1070) by C. Berrou and others. The coding by the concatenated convolutional code is executed by a system that concatenates two convolutional encoders via an large interleaver equal to the length of a code in units of information transmission. Decoding by the concatenated convolutional code is executed using a system composed of two encoding circuits for inputting/outputting soft-output code information, the system executes iterative decoding that the soft-output information of each code is repeatedly exchanged between the two decoding circuits and acquires the final result of decoding. Such soft-output interactive decoding can effectively realize maximum-likelihood decoding for concatenated coding and can realize the maximum-likelihood decoding of a code sequence.

The invention provides means for realizing the principle of Turbo coding/decoding by the encoder 102 and the decoder 302 and greatly enhancing the reliability of recording/reproducing the information code sequence and simultaneously provides the concrete method and the concrete circuits for recovering the failure of code error correction in Turbo coding/decoding caused by disturbance such as various noise which may occur in an actual information recording/reproducing apparatus and keeping the information recording/reproducing apparatus at a higher reliability. Besides, the invention simultaneously provides a method and a circuit for reducing the delay of decoding by iterative decoding to a practical extent and a recording format for information data for them.

Generally, in Turbo coding/decoding, iterative decoding is executed using soft-output code information and at this time, the similar permutation (the shuffling) of code information to interleave used in coding is performed between the decoding. In well-known Turbo coding, as the permutation is executed in units of the whole codes (data sector), the iterative decoding does not converge in case the superimposition of unusual noise occurs at an extremely rare probability and a phenomenon that a code error diffuses (propagation) may occur. This is a phenomenon which may occur at a significant probability depending upon the configuration of a code even in a relatively satisfactory noise condition and can be observed as an error saturation characteristic called an error floor in an error rate characteristic. In such a coding system, even if the signal-to-noise (SN) ratio quality of a reproduced signal can be improved, information cannot be reproduced at reliability equal to or less than the error saturation characteristic.

As the soft-output decoding uses soft-output code information supposing the superimposition of random noise, it is extremely weak in the continuous signal deterioration such as the continuous amplitude loss (dropout) of a continuous reproduced signal caused by a burst defect on the recording medium and the abnormal variation and offset of a level and in this case, a code error is also magnified. For means for reconditioning such a situation, a method of concatenating hard-decision algebraic block codes such as a Reed-Solomon code is conceivable together with Turbo coding, however, as in normal concatenated coding, a range of the diffusion (propagation) of a code in permutation by Turbo decoding is large, the propagated errors cannot be securely covered and the concatenated coding does not work for such situation. To solve this problem, in the invention, coding and decoding in the following embodiments are executed in the encoder 102 and the decoder 302.

Second Embodiment

Figure 2:
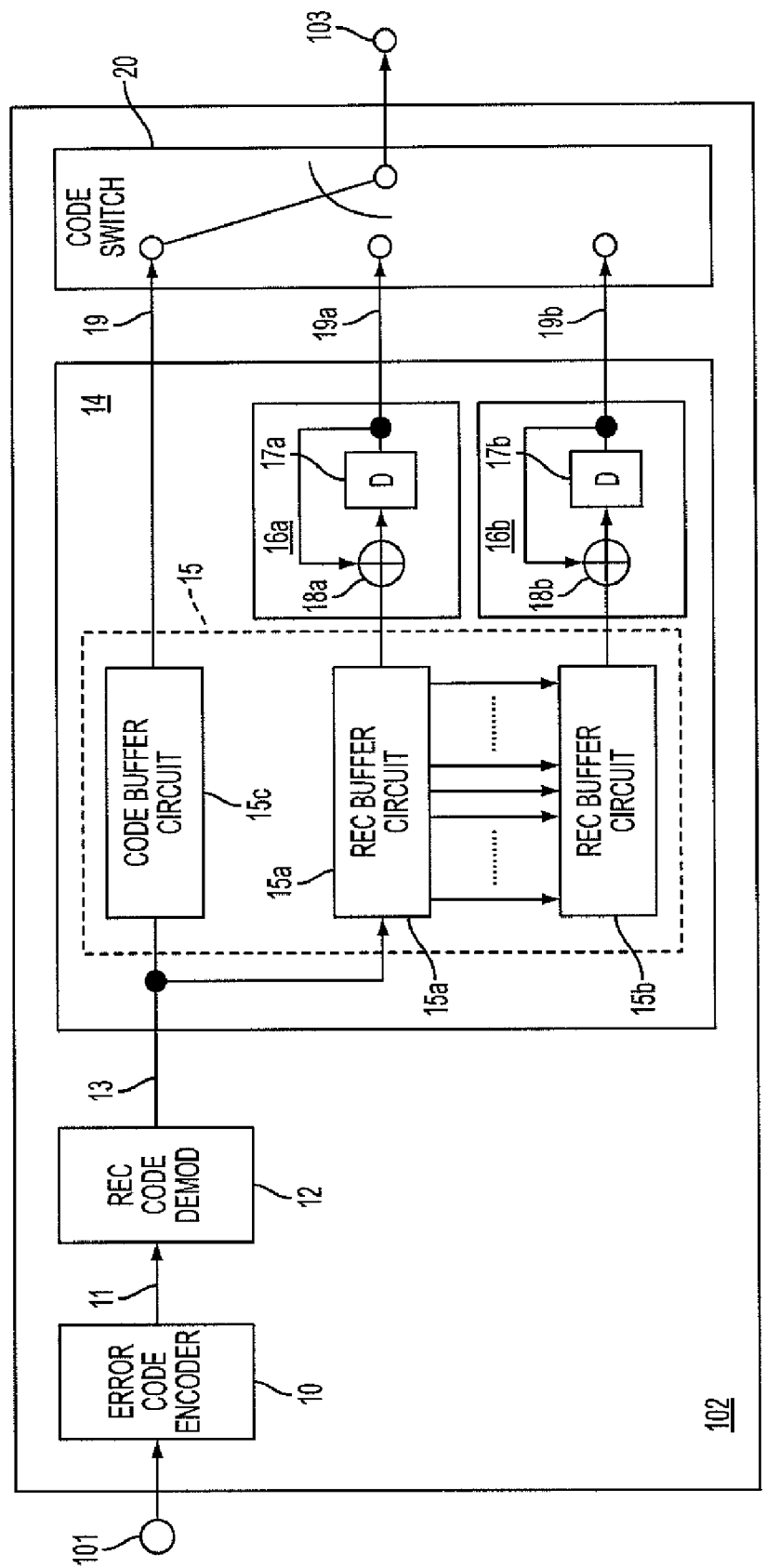
FIG. 2 shows an example of the configuration of a recording encoder (an encoding circuit in recording) according to the invention.

FIG. 2 shows an example of the configuration of the encoder (the encoding circuit in recording) 102 according to the invention. The encoder 102 is provided with an error-correction encoder (an error-correction encoding circuit) 10 for applying algebraic error-correction coding (first error-correction coding) by a Reed-Solomon code to an input information code sequence 101 and the error-correction encoder outputs an error-correction code sequence 11. In actual recording coding, recording modulation coding that a specific code constraint condition such as code run-length constraint is added to write data code sequence is required to be executed to guarantee the extraction of amplitude gain control/data timing recovery information from a reproduced signal, to inhibit a DC component in a recorded/reproduced signal or to remove a recording code pattern in which a reproduction error may occur beforehand, and a recording code modulator (a modulation circuit) 12 is provided to apply the coding conversion to the error-correction code sequence 11.

Further, a recording modulated code sequence 13 output from the recording code modulator 12 is input to a concatenated encoder (an encoding circuit that executes second error-correction coding) 14. The concatenated encoder 14 applies the second error-correction coding based upon a principle of Turbo coding to the recording modulated code sequence 13. The concatenated encoder 14 generates a predetermined redundant code based upon the input code sequence and also generates the similar redundant code based upon a new code sequence formed by rearranging the input code sequence. Therefore, the recording modulated code sequence 13 input to the concatenated encoder 14 is stored in a code buffer circuit 15c for holding the contents of a code sequence of predetermined code block length and the contents are held in recording buffer circuits 15a and 15b for changing the code bit position of the code sequence in fixed order and holding it. A circuit composed of the recording buffer circuits 15a and 15b for permuting a code is called a random interleaver 15 and generally, the contents of the code are rearranged according to a one to one code mapping rule with the length of a code sequence unchanged.

Turbo coding is characterized in that error-correction coding is applied to a sequence acquired by rearranging the same code sequence in different order via the interleaver. For a code mapping rule at this time, rearrangement in random order or rearrangement under a predetermined constraint condition is set, however, in a decoder 300 described later corresponding to one encoder, an unchanged code mapping rule is set. A specific conversion rule may be set depending on a code error event caused by the head/recording medium system 200 and a data transmission system, however, in the embodiment of the invention, this is not caused. In the concatenated encoder 14, referring to the contents of the code held in the recording buffer circuits 15a and 15b, a redundant code bit is generated by redundant encoders 16a and 16b.

In this embodiment, for the redundant encoders 16a and 16b (an encoding circuit that executes the second error-correction coding, in this case, a redundant bit is a redundant code output from these encoding circuits), a parity check coding method having the simplest configuration is disclosed, however, basically, for the configuration of the redundant encoder, the configuration of a recursive convolutional encoder is adopted. In the invention, each of the redundant encoders 16a and 16b is provided with each code delay element 17a, 17b and each exclusive-OR 18a, 18b with the next code is acquired by sequentially holding a 1-bit input code and feedbacking the contents. A parity check code bit is always held in the code delay elements 17a and 17b by sequentially applying this to an input code bit from the recording buffer circuits 15a and 15b (every time the reference of the contents of code information held in each recording buffer circuit 15a, 15b is started, the contents of the code delay elements 17a and 17b are initialized, and until code information in each buffer is sequentially referred and a code bit at each trailing end is output to the redundant encoders 16a and 16b, the recursive coding is repeated).

A code switch (switching circuit) 20 inserts one bit every fixed cycle of redundant code bit sequences 19a and 19b into the following information code 19 at predetermined timing, referring to original code information 19 stored in the recording buffer circuit 15 and sequentially outputting it and outputs as one recorded code sequence 103 (as described above, every time the output of the redundant code bit sequences 19a and 19b from each redundant encoder 16a, 16b is referred in the information code 19, the code delay element of the redundant encoder may be also reset). The coding is one type of punctured coding and the timing of the insertion of a redundant code bit at this time can be flexibly set according to set code redundancy. In such coding, systematic coding in which an original information code and the position of an inserted parity check code bit are definitely distinguished can be executed. The increase of redundancy is effective to enhance later error-correction ability, however, in the meantime, as the addition of code redundancy causes the effective loss of recording density, suitable amount of redundancy is required to be set in an actual information recording apparatus.

Besides, the invention is characterized in that the length of a code permuted by random interleave is limited by suitably setting the length of the recording buffer circuits 15a and 15b, for example, information data sector size is reduced to the length of a code divided in plurality. Besides, in this embodiment, the case that the two redundant encoders 16a and 16b are used is disclosed, however, in case a single encoder or three or more encoders are provided in parallel, the invention can be also applied. In case a single redundant encoder is used, it is general that referring to the output of the redundant encoder 16b in this embodiment, coding is performed. In the case of three or more redundant encoders, referring to the contents to which different interleave code permutation is applied of the recording buffer 15b, the similar coding is executed in parallel.

Third Embodiment

Figure 3:
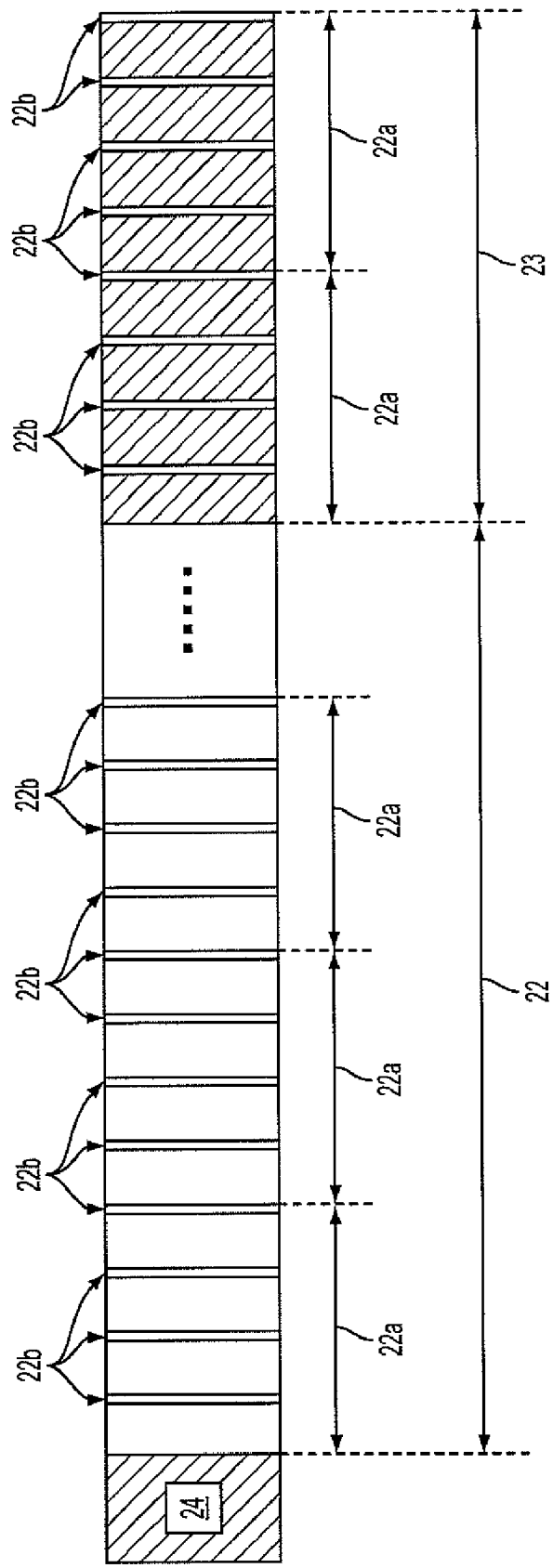
FIG. 3 shows an example of a recording format for information data of an information recording sector in a magnetic recording/reproduction apparatus according to the invention.

FIG. 3 shows a format for coding a recording code sequence output from the encoder 102, that is, an example of a recording format for information data according to the invention. The unit (an information data sector) of an information code once stored on a recording medium 200 in the invention has configuration shown in FIG. 3. The whole information data sector includes a preamble 24 including additional information for the control of recording positional information and amplitude gain control/data timing recovery, an information code 22 and a redundant code 23 including the Reed-Solomon code (the first error-correction code) added by the error-correction encoder 10 shown in FIG. 2 in the second embodiment at the end. The Reed-Solomon code can encode the corresponding code sequence in units of predetermined code symbol and can correct the code symbols including error codes, up to a predetermined number of correctable error code symbols, which is located in an arbitrary position of the information code 22 and the redundant code 23 on the corresponding sector in error correction using the redundant code 23. The detection and the correction of arbitrary errors to t pieces of symbols can be guaranteed by adding the redundant code 23 having the symbol length of 2t according to Reed-Solomon code error correction in a general well-known decoding method when the contents of a code on the information data sector are reproduced, and in a case of erasure correction, can identify a value of 2t pieces of symbols (one symbol is normally composed of continuous plural bits in the corresponding code sequence, for example, 8 to 10 code bits).

Further, as shown in FIG. 3, the information code 22 and the redundant code 23 in the recording information data sector are divided in units of plural code blocks 22a and each code block 22a has code length corresponding to the memory size of the recording buffer circuits 15a and 15b shown in FIG. 2. In each code block, a redundant code bit 22b (a parity coding bit) by the second error-correction coding generated in the redundant encoders 16a and 16b is inserted. That is, in the invention, a code has configuration that first error-correction coding by the Reed-Solomon code and second error-correction coding by Turbo coding are concatenated with different code lengths. In this embodiment, the redundant code bit 22b is composed of plural parity coding bits forming an output parity from each redundant encoder 16a, 16b and code length in interleave code permutation processing between the recording buffer circuits 15a and 15b executed in each parity coding corresponds to each code block 22a.

In other words, the invention is characterized in that the recording information data sector (the information code 22 and the redundant code 23 based upon the Reed-Solomon code) is divided into plural code blocks 22a and the second error-correction coding (parity coding) is performed in units of divided individual code block 22a, and in case Turbo decoding is repeated between plural parity codes in each code block 22a, the diffusion and propagation of a code error in the failure of decoding is limited to the length of code block 22a at most. Therefore, if coding (redundant 2t pieces of symbols or more, in correction for loss, t pieces of symbols or more) is performed so that the maximum number t of correctable symbols in a Reed-Solomon code added as the redundant code 23 is the block length or longer, a decoding error in the failure of Turbo decoding can be finally corrected.

In the meantime, Turbo coding by parity coding in units of code block 22a into which the information data sector is divided as in the invention for normal Turbo coding having the whole information data sector as a code configuration unit deteriorates the error rate of random error correction by iterative decoding at ratio inversely proportional to the length of a code configuration unit (the code block 22a), however, the correction ability for a burst propagated error can be also compensated by limiting the length of a code configuration block to error length in which recovery by a Reed-Solomon code can be compensated in the failure of Turbo decoding as in the invention, supplementing the deterioration, and optimum reliability can be realized in the whole data decoding system.

The unit (the information data sector) of an information code sequence once recorded on the information recording medium in the embodiment of the invention has the following characteristics. (1) Error correction in a predetermined code unit (a code symbol) is performed, first error-correction coding for correcting code symbols including code errors up to the predetermined number or less of code error symbols in the corresponding reproduced sector is executed and a redundant code sequence by this is added to the corresponding information data sector. (2) The information data sector to which the first error-correction coding is applied is divided into continuous plural code sequence blocks having a predetermined length, second error-correction coding is applied to each code sequence block and after a redundant code by this is inserted into the corresponding code sequence block, they are recorded on the corresponding information recording medium. (3) The code sequence block to which the second error-correction coding is applied has a code sequence block length in units of code symbol in the first error-correction coding and has a code sequence block length equal to or less than the number of error code symbols which can be corrected by the first error-correction coding. The information code sequence to which the error-correction coding having the above-mentioned features is applied is recorded on the information recording medium 200 or a circuit for applying the error-correction coding having the above-mentioned features is provided in the encoder 102.

At this time, in the second error-correction coding, a recorded code sequence by Turbo coding having features that code permutation processing having code length equal to the code sequence block as a processing unit is applied to a code sequence corresponding to the above-mentioned code sequence block, plural code sequence blocks are generated, predetermined error-correction coding is applied to the generated plural code sequence blocks and a redundant bit generated by each error-correction coding is inserted in a predetermined position in the corresponding code sequence block is configured. Therefore, the encoder is characterized in that a code permutation circuit having a code length equal to the code sequence block as a processing unit and a memory circuit for holding the result of code permutation equal to the code sequence block are provided, an encoding circuit for applying the predetermined second error-correction coding, referring to the contents of the plural memory circuits is provided and circuit means for inserting a redundant bit output by each encoding circuit in a predetermined position in the corresponding code sequence block held in the memory circuit beforehand is provided.

Figure 14:
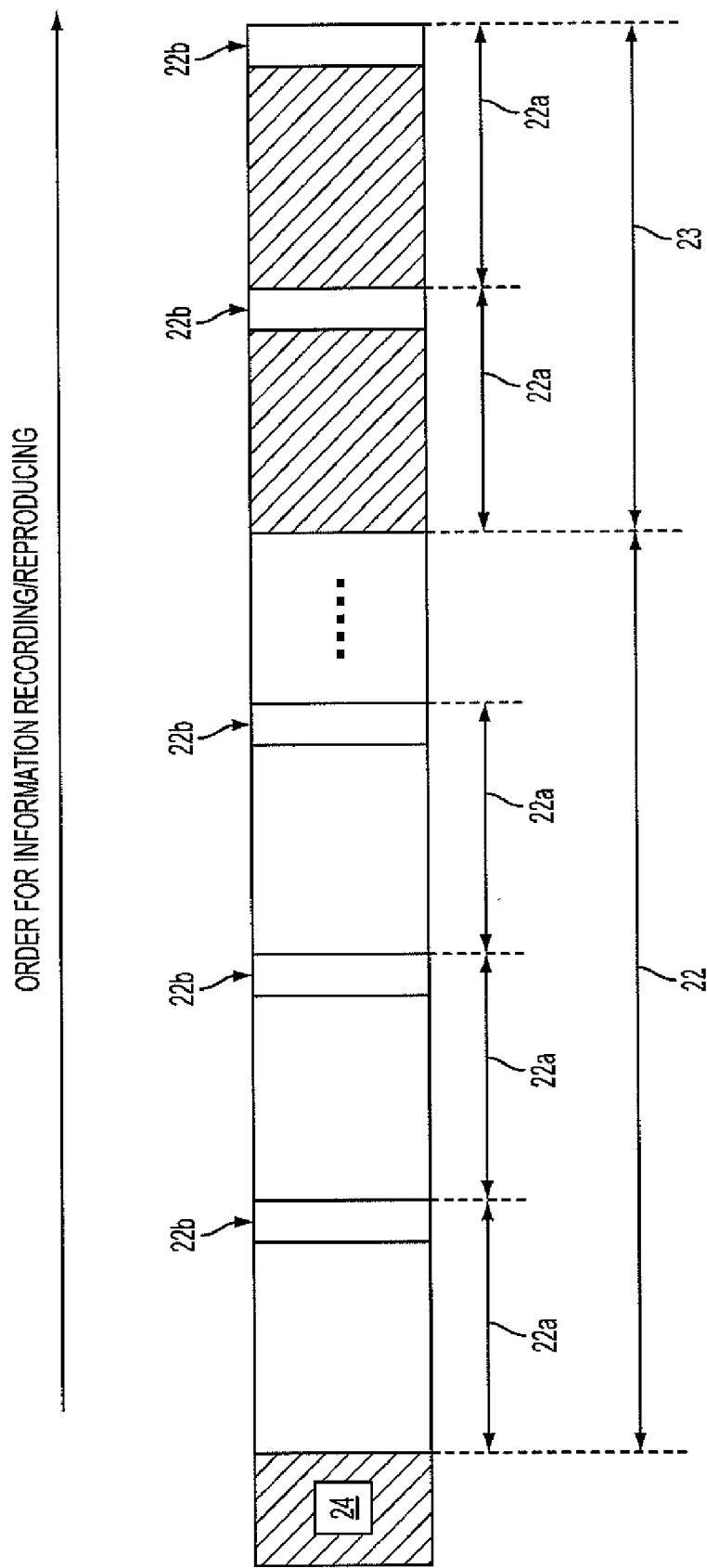
FIG. 14 shows another example of the recording format for information data of the information recording sector in the magnetic recording/reproduction apparatus according to the invention.

In the third embodiment shown in FIG. 3, a redundant code bit (a parity coding bit) 22b added into each code block 22a is arranged at a fixed bit interval in the block. The parity coding arrangement in which the parity redundant code bits 22b is separately distributed or scattered in each code block 22a may be helpful to prevent most of redundant code bits from simultaneously being deteriorated by a burst signal defect localized at certain bit positions in the code block 22a. Meanwhile, as shown in FIG. 14, the redundant code bit may be collectively arranged in a predetermined position (for example, at the trailing end of each code block) in each code block. In this case, redundant code bit sequences 19a and 19b which are the output of the encoder shown in FIG. 2 in the second embodiment are once held in a buffer and are collectively added in a predetermined code block position. These characteristics of the invention on the recording information data sector are given as the characteristics of a recording code sequence format on the recording medium and in addition, the embodiment in the corresponding circuit can be verified for formats of the write current sequence 105, the reproduced signal sequence 305 and the reproduced code sequence which are input/output to/from the recorded/reproduced signal processing circuit 1.

Fourth Embodiment

Figure 4:
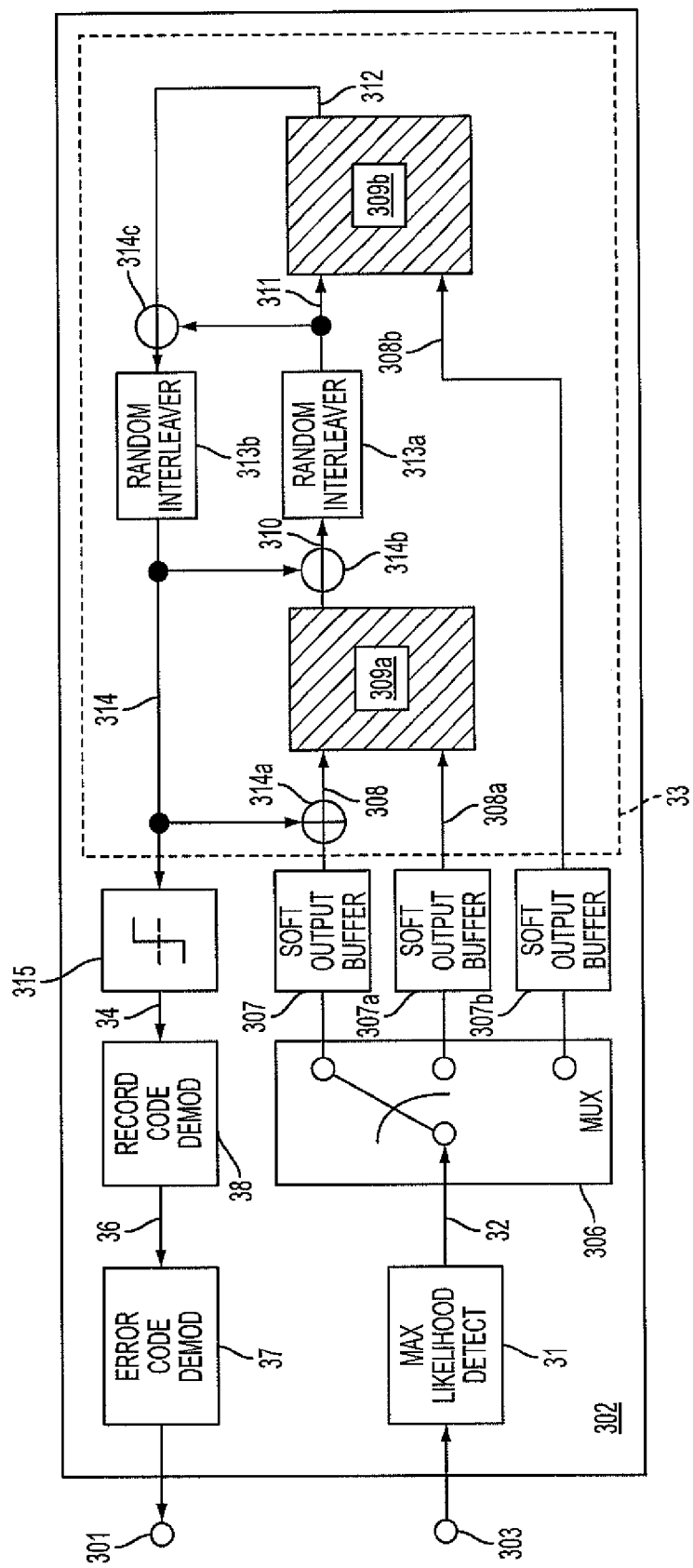
FIG. 4 shows an example of an error-correction decoder (an error-correction encoding circuit in decoding) according to the invention.

FIG. 4 shows an example of the configuration of an error correction decoder (an error-correction encoding circuit in decoding) 302 in the invention. In the decoder 302 equivalent to the fourth embodiment and shown in FIG. 4 corresponding to the second embodiment shown in FIG. 2, a decoded signal sequence 303 which is output from the reproduced signal processing circuit 304 is input and data demodulation to a reproduced code information 301 is realized. In the decoder 302, a maximum-likelihood detector 31 receives produced signal information (generally a sequence of a digital signal value) from the reproduced signal processing circuit 304 and determines a code bit information sequence corresponding to the reproduced signal information. Generally, in a recording/reproduction system using PRML, a digital signal sequence after partial response equalization by a digital filter is converted to hard-decision reproduced code bit information $\{a_k\}$ by the maximum-likelihood detector.

However, in the invention, as error correction based upon Turbo decoding is executed in a succeeding iterative detector 33, maximum posterior probability determination (maximum a posterior (MAP) decoding) matched with code detection for the partial response redundant system is executed in place of the maximum-likelihood detector and each code bit information is output as soft-output code information $\{b_k\}$ which is multivalued information shown by the reliability (probability) of the code bit. The algorithm of the MAP decoding and a concrete configuration method are widely disclosed in the nonpatent reference document 2 and a document ("Implementation and performance of a serial MAP decoder for use in an iterative turbo decoder", in Proc. IEEE International Symposium on Information Theory, Sep. 1995, pp. 471) for example and further simplified various methods may exist, however, in the invention, the configuration of the MAP decoding may be also formed by any method.

The soft-output code information sequence 32 output from the maximum-likelihood detector 31 by the MAP decoding is input to the iterative detector 33 (a Turbo error correction decoder), error correction described in detail is performed and an error-correction decoded sequence 34 which is hard-decision bit information is output. A recorded code demodulator 35 is a circuit that executes coding demodulation of reverse conversion corresponding to the recorded code modulator 12 shown in FIG. 2 and outputs a recorded demodulated code sequence 36. Further, an error-correction demodulator (demodulating circuit) 37 is a circuit that corrects a code error in the recorded demodulated code sequence 36 using first error-correction coding (the redundant code 23) by the Reed-Solomon code and executes hard-decision error-correction decoding. Hereby, a reproduced code sequence 301 is regenerated.

In this embodiment, the error correction based upon Turbo decoding in the iterative detector (detection circuit) 33 is a first features. The soft-output code sequence 32 input to the iterative detector 33 is distributed into soft-output information corresponding to an original information sequence code and soft-output information corresponding to each parity code bit (the redundant code bit 22b shown in FIGS. 3 and 14) respectively added in the redundant encoders (encoding circuit) 16a and 16b via a multiplexer 306. That is, the multiplexer 306 is a circuit that executes reverse operation to the code switch 20, divides a series of soft-output code sequence 32, memorizes and holds soft-output information equivalent to the original recording information of a user in a soft-output buffer 307 and respectively memorizes and holds soft-output information equivalent to each parity code bit respectively added in the redundant encoders 16a and 16b in soft-output buffer circuits 307a and 307b. The soft-output buffer circuits 307a, 307b and 307c correspond to the code buffer circuits 15a, 15b and 15c, however, as processing delay time caused by succeeding iterative decoding is required to be absorbed, memory size large enough than the code buffer circuit and the code block 22b is often required.

Further, at the succeeding stage, error-correction processing in units of the code block 22b is executed using parity decoders (decoding circuits) 309a and 309b based upon the information held in the soft-output buffer circuits 307a, 307b and 307c.

In this embodiment, the parity decoder 309a corrects a code error using the redundant code bit sequence 19a from the redundant encoder 16a shown in the encoder in FIG. 2 in the second embodiment. That is, the parity decoder 309a receives soft-output information 308 (user code information) equivalent to the corresponding code block 22a in the soft-output buffer circuit 307 and soft-output information (a parity bit code soft-output information sequence 308a) corresponding to the redundant code bit 22b (the parity code information 19a by the redundant encoder 16a) of the corresponding code block 22a held in the soft-output buffer circuit 307a, and updates the input soft-output information 308 (the user code information) to more reliable information under a code constraint condition of the corresponding parity. The similar algorithm of MAP decoding to the maximum-likelihood detector 31 can be used for the updating of reliability. The soft-output information 308 of the corresponding block 22a is updated and output (as an updated soft-output block information sequence 310) by applying the similar algorithm of MAP decoding, being matched with the constraint condition of parity coding by the redundant encoder 16a. A method of realizing MAP decoding at high speed in the parity decoders 309a and 309b will be described in detail in a succeeding embodiment.

Further, after the same interleaving (code permutation) as the code block permutation (the code permutation from the code buffer 15a to 15b) in the random interleaver 15 in the encoder 102 is applied to the updated soft-output information sequence 310 by a random interleaver 313a, the soft-output information sequence is supplied to the parity decoder 309b (as a permuted soft-output block information sequence 311). That is, after reverse conversion (code permutation) to the predetermined code permutation is applied to the soft-output information sequence together with the corresponding soft-output information generated based upon a reproduced signal sequence, decoding is repeated again using this and the permuted soft-output block information sequence 311 is supplied to the parity decoder 309b.

At this time, the parity decoder 309b corrects a code error using a constraint of the redundant code bit sequence 19b from the redundant encoder 16b. That is, the parity decoder 309a receives the supplied soft-output block information sequence 311 (the user code information) and the parity code information 19b (a parity code soft-output information sequence 308b) of the corresponding code block 22a held in the soft-output buffer circuit 307b, and updates and outputs the input soft-output information 311 to more reliable information under a code constraint condition of the corresponding parity as in the parity decoder 309a.

Further, reverse code permutation to the random interleaver 313a is applied to the soft-output information (an updated soft-output block information sequence 312) output at this time by a random interleaver 313b, a soft-output information sequence (a permuted soft-output block information sequence 314) corresponding to the code sequence of the original code block 22a can be acquired and is feedback to the input of the parity decoder 309a again. As described above, the iterative decoder 33 is configured.

In iterative decoding, each information value of the updated and feedback soft-output information sequence 314 is added to the corresponding information value of the soft-output information sequence 308 of the corresponding code block already held in the soft-output buffer circuit 307 (in an adder 314a) or the permuted soft-output information sequence 314 is input to the parity decoder 309a as a newly revised soft-output information sequence 308. In the similar method to that described above, updated soft-output information is passed to the parity decoder 309b and the updating of the information is repeated. In a process of the iterative decoding, to subtract duplication between information added in inputting and original information, a value of soft-output information added in inputting is required to be subtracted from respective soft-output information values of the corresponding output in the output of each parity decoder 309a, 309b (in subtracters 314b and 314c).

As described above, a value of each soft-output information is gradually improved to high reliability by repeating permutation, updating the soft-output information sequence 308 of the corresponding code block between the parity decoders 309a and 309b. After the repetition of parity decoding at a predetermined frequency, each value of the output soft-output information sequence 314 is compared with a predetermined value (in most cases, a value zero) by a level detector 315 and is converted to a binary code value based upon the result. The result is output as the code information sequence of the corresponding block, is supplied to a recording code demodulator 35 as an error-correction decoded sequence 34 and reverse code demodulation to the recording code modulator 12 is applied via the recording code demodulator. A recording demodulated code sequence 36 is output as reproduced code information 301 after error detection/correction by first error-correction coding is further applied to the recording demodulated code sequence in an error-correction demodulator 37.

In the embodiment described above, corresponding to the coding shown in FIG. 2 in the second embodiment, in the detection/correction of a code error by second error-correction coding, the detection and the correction of a code error using the soft-output information of each code bit generated based upon a signal sequence reproduced from the recording medium are performed, decoding corresponding to each parity error-correction coding applied to each code sequence block is repeated again using the soft-output information generated based upon the reproduced signal sequence and the soft-output decoding information of each code bit acquired based upon the result of another decoding. And after the above-mentioned process is repeated by a predetermined frequency, the result is output as the result of the reproduction of the information code sequence. The error-correction processing means provided with the above-mentioned characteristics is provided in the invention.

Besides, for an error-correction decoding circuit, a soft-output decoder that receives a reproduced signal sequence supplied from the recording medium and outputs the soft-output information of each code bit so as to detect and correct a code error by the second error-correction coding is provided. Each of plural error-correction decoding circuits that detect and correct a code error using each the error-correction coding applied to each code sequence block receives the soft-output information of each code bit output from the soft-output decoder, receives soft-output information output from another error-correction decoding circuit, repeats the detection and the correction of a code error of each code sequence block plural times and outputs the result as the reproduction of an information code sequence after the above-mentioned detection and correction of a code error are repeated by a predetermined frequency (iteration number). The error-correction decoding circuit (the error-correction encoding circuit in reproduction) provided with the above-mentioned characteristics is provided.

Fifth Embodiment

Figure 5:
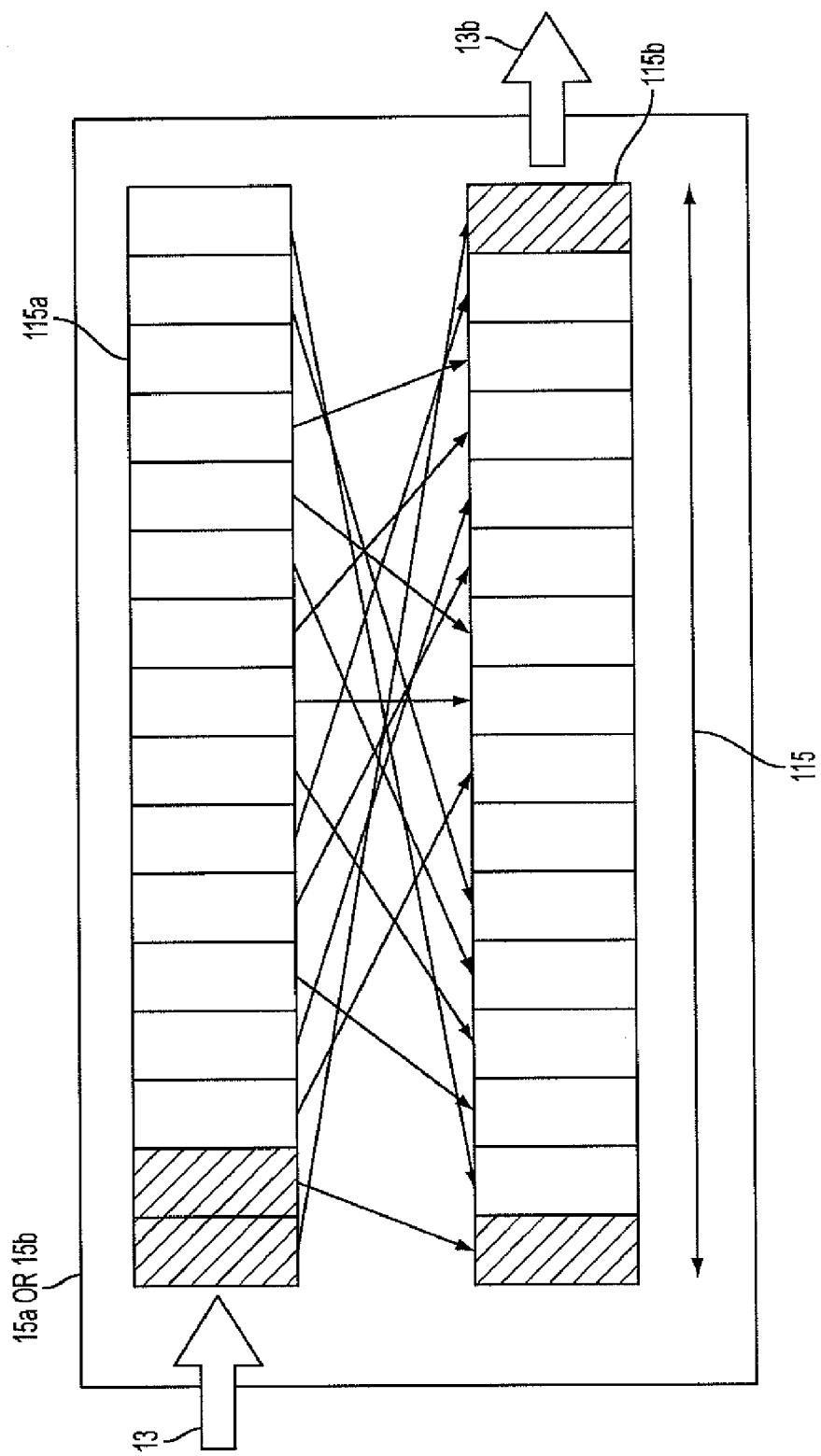
FIG. 5 shows an example of an error-correction encoding circuit (a random interleaver/deinterleaver) in recording according to the invention.

FIG. 5 shows an example of the configuration of a random interleaver (circuit) having a feature of the encoder (the error-correction encoding circuit in recording) provided by the invention. As described above, the invention is characterized in that based upon the principle of Turbo coding, the generation and the addition of a parity redundant code are performed in units of code block 22*a* acquired by dividing the information code 22 in a recording information data sector in plurality. Therefore, in each code buffer circuit 15*a* or 15*b* for supplying a code to each redundant encoder 16*a*, 16*b* for generating parity, code registers 115*a* and 115*b* having a register length 115 equivalent to the length of a user recording information code in each code block 22*a* are provided. Further, to generate a parity redundant code by Turbo coding, predetermined code permutation way in which the order of held code information is permuted is applied between the code registers based upon pseudorandom regularity, afterward, the permuted code information in units of code block is serially input to the redundant encoder 16*a* or 16*b* and a 1- or more-bit redundant code is acquired.

Each code value of the recording modulated code sequence 13 input to the code buffer circuit (the recording buffer circuit) 15*a* or 15*b* provided with a function of an interleaver is sequentially input to the code register 115*a* and is held, being shifted. Further, every time a code for one code block 22*a* is held in the code register 115*a*, the order of the contents of the held code value are permuted according to a predetermined code permutation rule and the contents are copied in the code register 115*b*. The contents of the code register 115*b* are serially read out as the interleave output of the code buffer circuit 15*a* or 15*b*. Code permutation processing from the code register 115*a* to 115*b* is executed with the length of a user recording information code in the code block 22*a* as a cycle and when a code value held at the input terminal of the code register 115*a* is sequentially shifted and is removed from the trailing end at the executed timing of the code permutation processing, the next code permutation processing is executed. Further, the contents of the code delay element 17*a*, 17*b* in the corresponding redundant encoder 16*a*, 16*b* are reset to a predetermined initial value at the executed timing of the code permutation processing. Hereby, the generation of a parity code is independently executed between each code block 22*a*.

It is desirable that the permutation of a code in interleave in the code buffer circuit 15*a* or 15*b* complies with an ideal random permutation rule in case there is no regularity in the occurrence (event) of a code error, however, for example, in case event the probability of code errors in continuous bit positions is remarkably high in a partial response transmission system, a code permutation rule is set so that the continuous bit positions are separated at as a distant interval as possible. For example, in a recording/reproduction system in which a code error of N bits in length is frequently caused, a permutation rule is set so that at least two of continuous N-bit positions in the code register 115*a* are arranged in the code register 115*b* apart by a predetermined code bit distance L or longer. At this time, if a parity redundant code is coded so that a redundant code bit (a parity coded bit) 22*b* is generated at an interval of L-1 bits for the code block 22*a*, an error code can be efficiently corrected by the iterative decoding.

Sixth Embodiment

An embodiment of parity coding according to the invention will be described below. When in the above-mentioned parity coding, a recording information code sequence $(x_0,x_1,x_2,x_3,x_4,x_5,x_6,x_7,x_8,x_9)$ ($x_i$: binary code bit of 0 or 1) having 10-bit length is set in a code block 22*a* in the code register 115*a* of the code buffer circuit 15*a*, the result acquired by permuting the order of the code by interleave shall be $(a_0,a_1,a_2,a_3,a_4,a_5,a_6,a_7,a_8,a_9)$. In case a redundant code is added every 5 bits when the code delay element 17*a* generates and outputs a redundant code sequence $(pa_0,pa_1,pa_2,pa_3,pa_4,pa_5,pa_6,pa_7,pa_8,pa_9)$ based upon the input of the code using an odd-even single parity (initial value: zero) as the redundant encoder 16*a*, a parity code is inserted every 5 bits in the code sequence and a code sequence for the corresponding code block 22*a* finally output from the encoder 102 is $(x_0,x_1,x_2,x_3,x_4,\underline{pa_4},x_5,x_6,x_7,x_8,x_9,\underline{pa_9})$ (The underlined codes are equivalent to the redundant code bit 22*b* shown in FIG. 3).

Or a parity redundant code is arranged in the code block 22*a* or in a predetermined position in a recording information sector and for example, is collectively arranged at the trailing end of the block as $(x_0,x_1,x_2,x_3,x_4,x_5,x_6,x_7,x_8,x_9,\underline{pa_4},\underline{pa_9})$ (The underlined codes are equivalent to a redundant code bit 22b shown in FIG. 14). At this time, the parity redundant codes pa$_4$ and pa$_9$ show the odd-even state of the codes (odd number or even number of emergent frequency of code 1) from the head of the permuted code sequence (a$_0$,a$_1$,a$_2$,a$_3$,a$_4$, a$_5$,a$_6$,a$_7$,a$_8$,a$_9$) to the code a$_4$ and the code a$_9$, the parity decoder 309a that executes error correction corresponding to the redundant parity on the reproduction side updates soft-output information by using a constraint condition of the odd-even state by the parity redundant codes for the soft output of the corresponding code block (x$_0$,x$_1$,x$_2$,x$_3$,x$_4$,x$_5$,x$_6$, x$_7$,x$_8$,x$_9$).

In addition to the case the single redundant encoder 16a is used as described above, the case that plural redundant encoders (parity coding) are used in parallel for coding is already shown in FIG. 2 in the second embodiment. In this case, the second code buffer circuit 15b that supplies an input code to the second redundant encoder 16b executes interleave code permutation different from the first code buffer circuit 15a (Or in the first code buffer circuit 15a, no code permutation is executed, the parity coding is executed with the input code sequence as it is and in the second code buffer circuit 15b, specific interleave permutation is executed).

In this case, if plural parity coding is executed under the similar coding condition, a code sequence output from the encoder 102 is (x$_0$,x$_1$ x$_2$,x$_3$,x$_4$,pa$_4$,pa$_4$,x$_5$,x$_6$,x$_7$,x$_8$,x$_9$,pa$_9$,pb$_9$) (the underlined code is equivalent to the redundant code bit 22b shown in FIG. 3) or (x$_0$,x$_1$,x$_2$,x$_3$,x$_4$,x$_5$,x$_6$,x$_7$,x$_8$,x$_9$,pa$_4$, pa$_9$,pb$_4$,pb$_9$) (the underlined code is equivalent to the redundant code bit 22b shown in FIG. 14) when the redundant encoder 16b generates a redundant code sequence (pb$_0$,pb$_1$, pb$_2$,pb$_3$,pb$_4$,pb$_5$,pb$_6$,pb$_7$,pb$_8$,pb$_9$) for a code permuted in the code buffer circuit 15b (b$_0$,b$_1$,b$_2$,b$_3$,b$_4$,b$_5$,b$_6$,b$_7$,b$_8$,b$_9$). In this case, the respective soft-output information of the parity redundant codes (pa$_4$ and pa$_9$) and (pb$_4$ and pb$_9$) is independently used in the corresponding plural parity decoders 309a and 309b, and the soft-output information of the corresponding code block (x$_0$,x$_1$,x$_2$,x$_3$,x$_4$,x$_5$,x$_6$,x$_7$,x$_8$,x$_9$) is updated.

In this example, the number of parity redundant codes generated for the code block 22a by plural parity coding is the same, however, taking account of the redundancy of the whole code sequence, the number of parity redundant code bits can be set to a different number every parity coding (redundant encoder). In the invention, three or more redundant encoders can be also provided in parallel and in each code buffer circuit 15a corresponding to these, desired performance can be acquired by executing interleave conversion processing in order according to different code permutation rules based upon interleave configuration shown in FIG. 5 (Parity redundant coding is allocated to each code information by the number of redundant encoders). In this case, as described in the embodiment shown in FIG. 4, the parity decoder 309a on the side of the decoder 302 are cascaded by the number of redundant encoders 16a, the result of soft output is sequentially received and sent out to the following decoder, and iterative decoding is executed.

In the parity coding in each redundant encoder, a coding method of resetting the contents of the code delay element 17a to an initial value every time a parity redundant code is output from the redundant encoder 16a can be also adopted. As described above, a code sequence of a code block after interleave input to each redundant encoder is (a$_0$,a$_1$,a$_2$,a$_3$,a$_4$, a$_5$,a$_6$,a$_7$,a$_8$,a$_9$) and when pa$_4$ and pa$_9$ in a redundant code sequence (pa$_0$,pa$_1$,pa$_2$,pa$_3$,pa$_4$,pa$_5$,pa$_6$,pa$_7$,pa$_8$,pa$_9$) generated in response to the input of the code is added as redundant parity, the contents of the code delay element 17a are reset to an initial value zero at timing at which the two redundant codes (pa$_4$, pa$_9$) are referred. At this time, coding is independently executed in a code sequence before and after resetting and the following code constraint condition comes into existence.

$$a_0(+)a_1(+)a_2(+)a_3(+)a_4(+)\underline{pa_4}=0$$

$$a_5(+)a_6(+)a_7(+)a_8(+)a_9(+)\underline{pa_9}=0 \quad (1)$$

(Here, (+) denotes exclusive or operation)

As described above, in this embodiment using single parity, in each parity coding, each information code bit a$_1$ belongs to one of code blocks constrained by respective generated parity redundant codes. When pb$_4$ and pb$_9$ out of generated redundant parity are added to another interleave permuted code sequence (b$_0$,b$_1$,b$_2$,b$_3$,b$_4$,b$_5$,b$_6$,b$_7$,b$_8$,b$_9$), a code constraint condition comes into existence as in (1) as follows.

$$b_0(+)b_1(+)b_2(+)b_3(+)b_4(+)\underline{pb_4}=0$$

$$b_5(+)b_6(+)b_7(+)b_8(+)b_9(+)\underline{pb_9}=0 \quad (2)$$

Each information code is in different combination under the two code constraint conditions by different two-way (generally, plural) interleaving for a code sequence and the update of the soft-output reliability of each code under one constraint condition contributes to the improvement of soft-output reliability by the other constraint condition.

As shown in above (1) and (2), the improvement of code soft-output information under the independently blocked code constraint condition can be realized by extremely simple algorithm. As described above, when a code block {x$_0$,x$_1$, x$_2$,x$_3$,x$_4$,x$_5$} is constrained under a condition x$_0$(+)x$_1$(+)x$_2$(+) x$_3$(+)x$_4$(+)x$_5$=0, the soft-output maximum-likelihood information {r$_0$,r$_1$,r$_2$,r$_3$,r$_4$,r$_5$} of each code in the code block is updated based upon the soft-output maximum-likelihood information {$\underline{r_0}$,$\underline{r_1}$,$\underline{r_2}$,$\underline{r_3}$,$\underline{r_4}$,$\underline{r_5}$} of each code before update by the following operation.

$$r_k=2*atanh[(\pi_{i=0:5/k}tanh(\underline{r_i}/2))] \quad (3)$$

($\pi_{i=0:5/k}$ shows the product of all elements of index i=0 to 5 except k.)

Then, the soft-output maximum-likelihood is expressed by logarithmic probability maximum-likelihood ratio r$_k$=log [P(probability that code value at time k is 1)/P (probability that code value at time k is 0)], probability that if r$_k$ is a positive value, its code value is 1 and if r$_k$ is a negative value, its code value is 0 is high and its absolute value denotes reliability the code value. The expression (3) shows that the decoding (updating) of each soft-output code information in each block under a code constraint can be independently executed in parallel for extremely high speed operation at a single bit time interval.

As described above, as the independent and parallel update of soft-output information can be applied to each code block to which a parity redundant code is added in case independent single parity coding in this embodiment is executed and operation for updating in an individual block can be executed at extremely simple and short operation delay as shown in the expression (3), decoding delay time (latency) can be extremely short even if iterative decoding is executed between plural parity decoders 309a and 309b. In this embodiment of the invention, the extremely effective method for making the enhancement of error-correction ability by Turbo decoding principle and the reduction of decoding delay time consist and the circuit for embodying the method are realized by independently applying one or more single parity coding to a recording information block via interleave code permutation and executing iterative decoding between each parity code.

Seventh Embodiment

Figure 6:
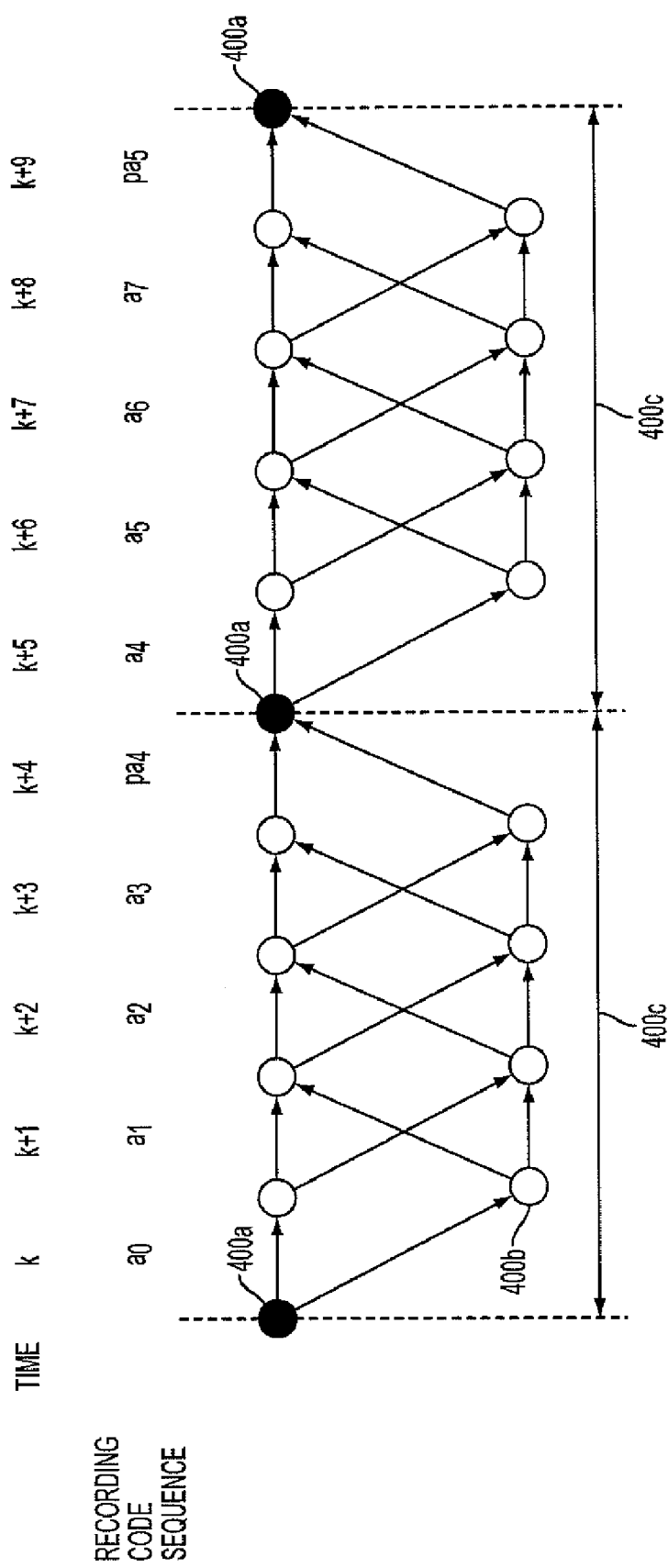
FIG. 6 is a trellis diagram used for a parity decoder (decoding circuit) according to the invention.

FIG. 6 shows the advantage of soft-output decoding by single parity coding according to the invention. FIG. 6 is a trellis diagram used for MAP soft-output decoding in a parity decoder (decoding circuit) and arrows show a time course in the 2-state trellis diagram showing the odd-even state of a code sequence. FIG. 6 is equivalent to a case that when a single parity redundant code sequence ($pa_0, pa_1, pa_2, pa_3, pa_4, pa_5, pa_6, pa_7$) is generated and output for an information code sequence ($a_0, a_1, a_2, a_3, a_4, a_5, a_6, a_7$), redundant codes $pa_3$ and $pa_7$ are added every 4 bits. The above-mentioned 8-bit information code sequence started at time k can have arbitrary state transition between two states (a constrained state (an even state) 400a and an odd state 400b) in the trellis diagram. As the initial state of the redundant encoder 16a is reset to either state (in this case, a state that the emergent frequency of a code 1 which zeroises a state of the code delay element 17a is even), a trellis initial state before the time k is fixed to the constrained state (the even state) 400a.

Besides, as a recording information code sequence is forcedly constrained at an time interval of five bits by the insertion of added redundant codes $pa_3$ and $pa_7$, a state of a trellis is forcedly transferred to the constrained state (the even state) 400a after time bit k+4 and k+9 again. As a result, the trellis diagram is divided into two blocks (a parity coding block 400c) and this shows that the result of soft-output decoding in one block has no effect upon output and update by soft-output decoding in the other block. Hereby, soft-output decoding (the update of soft-output information) can be independently executed in every code block to which parity coding is applied and this means that parallel decoding every parity coding block is enabled. This is an effective advantage to reduce decoding delay time and to reproduce recorded information at high speed in the information recording/reproducing apparatus.

In the above-mentioned seventh embodiment, the redundant encoder 16a mainly configured by the single code delay element 17a is used for the addition of parity redundancy used in the encoder 102, however, coding applied in this embodiment is not restricted to single parity coding. Further, in accordance with the characteristic of a code error, more general convolutional coding can be used.

Eighth Embodiment

Figure 7:
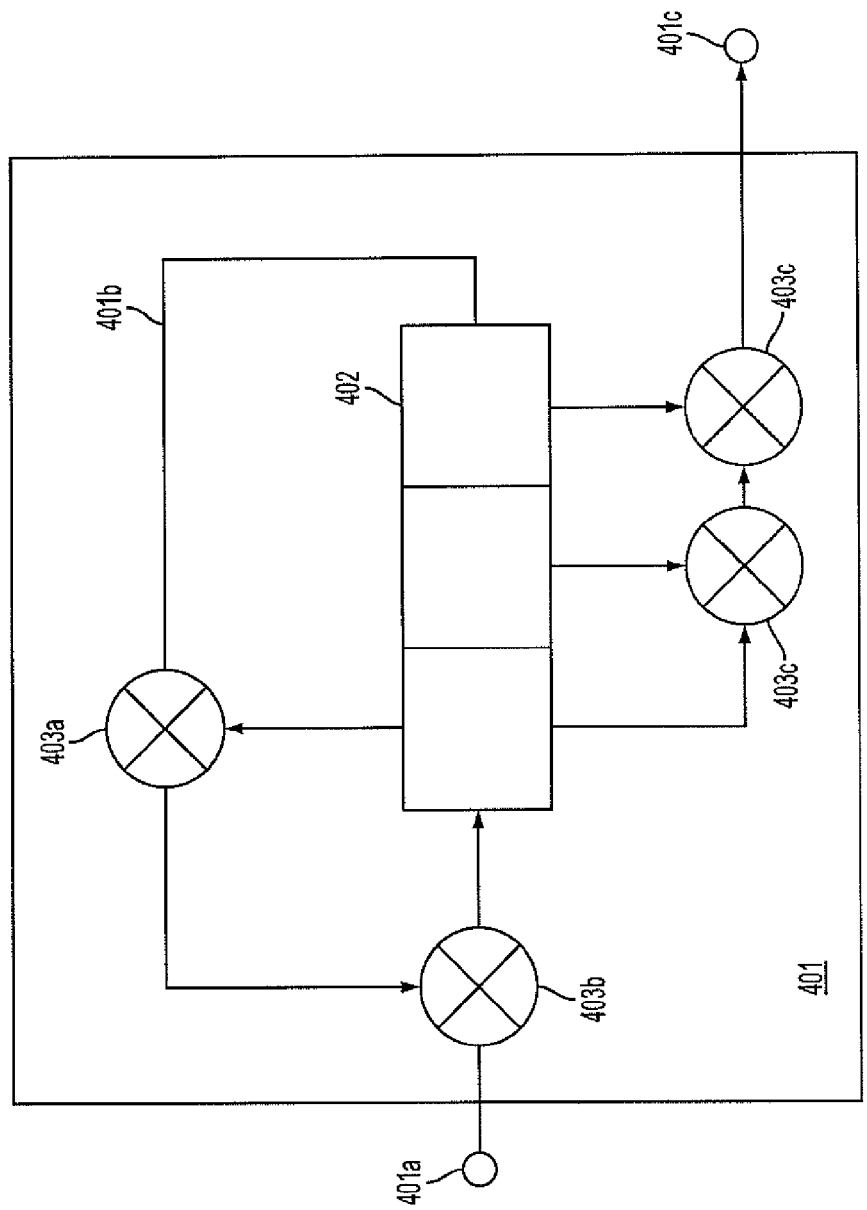
FIG. 7 shows an example of the configuration of a convolutional code of a code redundancy arrangement (redundancy circuit) according to the invention.

FIG. 7 shows one example of the configuration of a convolutional encoder equivalent to an eighth embodiment of the invention and in the convolutional encoder (encoding circuit) 401, a shift register 402 that holds a 3-bit code is used for a code delay element. The contents of the shift register are sequentially shifted together with input to the input terminal 401a of the encoder and those contents show a state of the encoder. Further, the convolutional encoder 401 according to the invention is characterized in that the encoder has recursive configuration that exclusive-OR operation for the contents in a specific position of the shift register 402 feedback to input 401a to the encoder is carried out. Besides, the contents in a specific position of the shift register 402 are also referred for the output 401c of the encoder and the output is performed by sequentially operating the exclusive-OR operation for these contents (exclusive-OR arithmetic elements 403a, 403b, 403c).

The above-mentioned single parity coding is the simplest example of the convolutional coding in case the shift register 402 is configured by a signal delay element, however, as in the data demodulating system based upon the partial response method in magnetic recording, in the case of a demodulation system in which a single- or an odd-bit code error events are frequently caused, relatively simple and efficient error-correction coding is provided. Further, for the more complex pattern of a code error event caused in a reproduced data sequence, the error event can be securely detected and corrected by applying the convolutional encoder 401 having more complex configuration as the redundant encoders 16a and 16b of the encoder 102.

For example, when the whole contents of the shift register 401 of the convolutional encoder are reset to zero and a supposed error pattern (a pattern sequence in which an error bit position is 1 and a normal code bit position is 0) is provided as input 401a to the encoder, the code error event with the error pattern can be detected by the convolutional coding if the whole contents of the shift register are not reset to zero finally. The application of the encoder having recursive configuration in the invention provides effect to induce error propagation in a reproduced data sequence and to facilitate the detection of a code error event when interleaving the reproduced data sequence.

Ninth Embodiment

Figure 10:
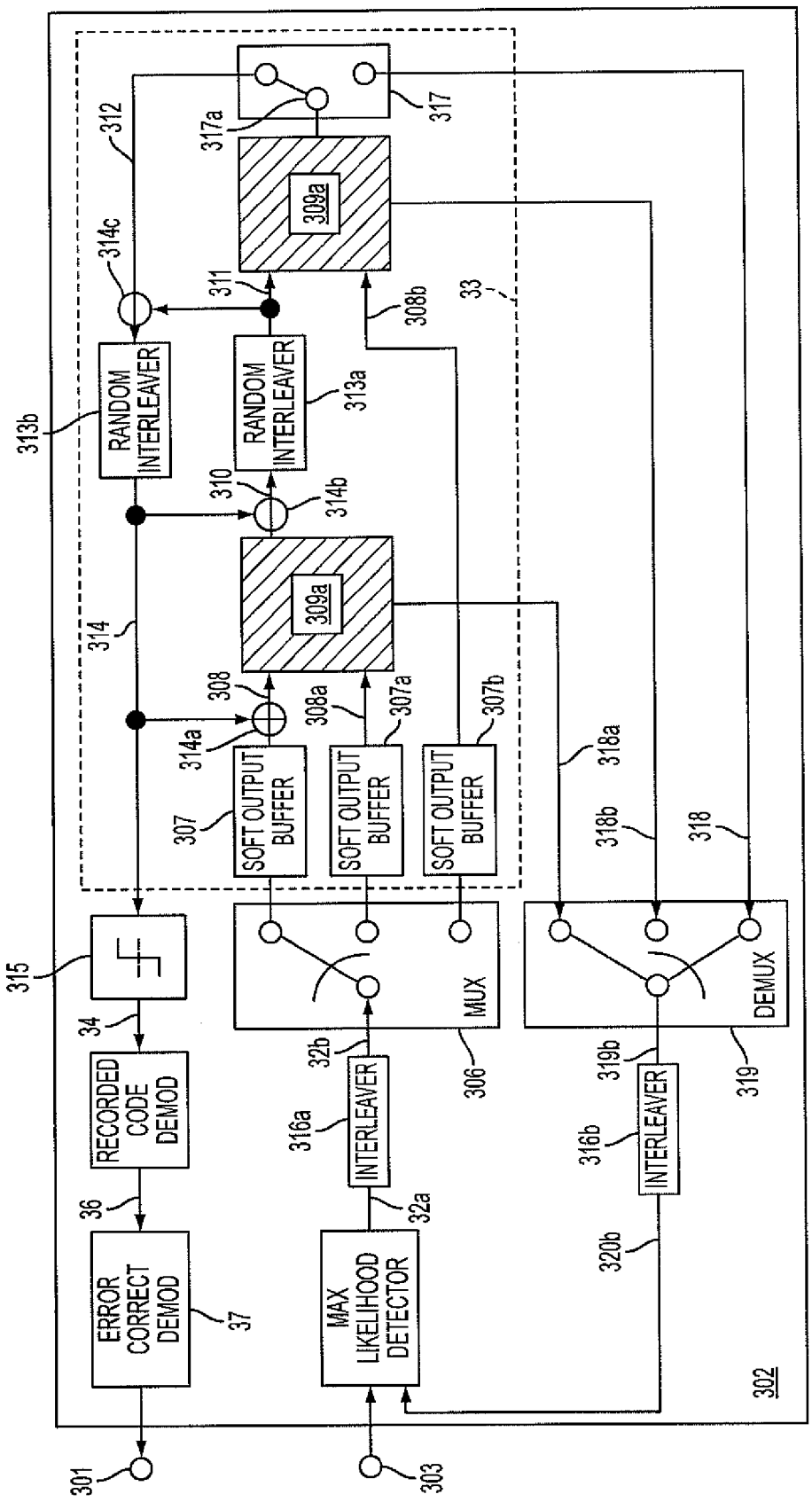
FIG. 10 shows an example of another configuration of the error-correction decoder (the error-correction encoding circuit in decoding) according to the invention.

For a further embodiment of the invention, exists an embodiment of decoding that after the detection and correction of a code error using the soft-output information for each code bit generated based upon a reproduced signal sequence from the recording medium by second error-correction coding by single parity coding or by second error-correction coding by iterative decoding between plural parity codes as described above, the soft-output decoding information for each code bit is feedback to the maximum-likelihood detector 31 again and the soft-output coding information for each bit in the corresponding information data sector is regenerated based upon the reproduced signal sequence and the feedback soft-output decoding information. FIG. 10 shows another embodiment of the error-correction decoder.

In a decoder 302 equivalent to this embodiment, a part encircled by a dotted line (an iterative decoder) 33 has basically the similar configuration and operation to that of the decoder in the fourth embodiment shown in FIG. 4. In a normal mode, the output terminal of a switch 317 is connected to the side of 312 according to an instruction signal 317a and the output of a parity decoder 309b is feedback as input information to a prior parity decoder 309a. In this state, in a system provided with plural parity decoders (parity coding) as shown in FIG. 10, as in the embodiment shown in FIG. 4, the input/output of soft-output code information between the parity decoders is repeated and soft-output reliability for each code bit is improved. After a predetermined iterative frequency, the output result is supplied to a level detector 315 via 314, is converted to an error-correction decoded sequence 34 to be the result of decoding.

The ninth embodiment is characterized in that after parity decoding is repeated up to a predetermined frequency (iteration number), the soft-output code information updated by the parity decoding for each code bit in the corresponding recording information data sector is feedback to a maximum-likelihood detector 31 again and the soft-output information for each code bit is reconfigured using the soft-output information for each code bit (soft-output code information 320b) together with the information of a decoded signal sequence 303 to further improve the reliability of decoding. Such a maximum-likelihood detector 31 is characterized in that feedback soft-output code information 320b the reliability of which is updated by the parity decoding is input again as the prior probability of each code bit information and is used in the maximum-likelihood detector 31.

Hereby, in the maximum-likelihood detector 31 that is matched with a partial response transmission system and evaluates posterior probability of each data code bit, the reliability deterioration of soft-output code information due to error propagation can be avoided. That is, if a code error bit corresponding to at least a part of error propagation is detected and the reliability of the code error bit can be improved by parity decoding, whole the continuous code error event due to error propagation caused in maximum-likelihood decoding which uses redundancy of intersymbol interference in the partial response transmission system and the deterioration at a burst of code bit reliability can be removed. Further, hereby, if the burst code error is improved, error-correction ability can be more effectively used for correcting a residual random bit code error in parity decoding executed again at the succeeding stage of the maximum-likelihood detector 31. As described above, the combination of the correction (first iterative decoding) for a random short error event by parity decoding and iterative decoding (second iterative decoding) in which maximum-likelihood decoding matched with the partial response transmission system is repeated can very efficiently correct a code error event in a realistic recording/reproduction system.

Tenth Embodiment

An example showing the adjustment of ability for correcting a random code error according to the invention will be described as a tenth embodiment below.

Feedback decoding (second iterative decoding) to the maximum-likelihood detector 31 using the result of iterative parity decoding can improve the reliability of the whole decoding system further at the maximum by suitably setting a frequency of the inner iterative decoding (first iterative decoding) between plural parity codes shown in the inside (33) of the dotted line shown in FIG. 10 and adjusting the capability for correcting a random code error event. As described above, for the inner iterative decoding (the first iterative decoding) between plural parity codes inside the dotted line, decoding in units of code block and high-speed decoding processing by parallelization are enabled and as the decoding processing is enabled at the delay of time for a few bits, a frequency of the two iterative decoding can be more flexibly set against the constraint of decoding delay time in a realistic high-speed recording/reproduction system.

The embodied configuration of the first iterative decoding is shown inside the dotted line shown in FIG. 10 (33) or is shown in FIG. 4 related to the fourth embodiment. Besides, the embodied configuration of the second iterative decoding is shown in FIG. 10 and the output of feedback soft-output code information (user recorded information) 318 from the switch 317 is feedback to the maximum-likelihood detector 31. To feedback the feedback soft-output code information to the maximum-likelihood detector 31, parity code feedback soft-output information sequences 318a, 318b are required to be inserted in original code positions of the feedback soft-output code information (user recorded information) 318 of the corresponding code block and one feedback soft-output code information sequence for each code block is required to be reconfigured. It is a demultiplexer 319 that executes this and the soft-output code information 318a, 318b (each output of the parity decoders 309a and 309b) of the corresponding parity code are inserted in predetermined positions of the feedback soft-output code information (user recorded information) of each code block, that is, code sequence conversion opposite to the multiplexer 306 is executed. Hereby, the configured feedback soft-output code information (user recorded information) of each code block is sent to the maximum-likelihood detector 31 as the prior probability information for each code bit.

Further, in the tenth embodiment, to efficiently apply parity correction to code error propagation which may occur in the maximum-likelihood detector 31 at the succeeding stage, permutation may be applied to a soft-output code information sequence 32a output from the maximum-likelihood detector 31 by an interleaver 316a. The interleaver 316a converts code bit arrangement so that soft-output code information output in a continuous code bit position on 32a is related to as different parity checks as possible, and facilitates the detection of a part of a burst code error event from the maximum-likelihood detector 31 by the parity decoding using soft-output code information 32b output from the interleaver. In the second iterative decoding, the possibility of burst error correction can be enhanced by the effect. The unit (block size) of permutation by the interleaver 316a is a single or plural blocks in units of code block 22a and further, may be also an information data sector (The unit is set depending upon the extent of error code propagation allowed when the second iterative decoding is executed, and the determination of the unit of permutation and the effect of improving a burst error correction are in the relation of trade-off).

In this case, in the second iterative decoding, a deinterleaver 316b for applying reverse processing for restoring permutation by the interleaver 316a to feedback soft-output code information 319b output from the demultiplexer is provided and hereby, feedback soft-output code information 320b permuted in original code order is supplied to the maximum-likelihood detector 31. In case soft output from the maximum-likelihood detector 31 is permuted by interleave as in this embodiment, recording code bit information is permuted in recording beforehand and is recorded on the recording medium so that parity decoding at the succeeding stage is suitably executed and the order of permuted code bits complies with a format of parity coding shown in FIG. 3.

Eleventh Embodiment

Figure 8:
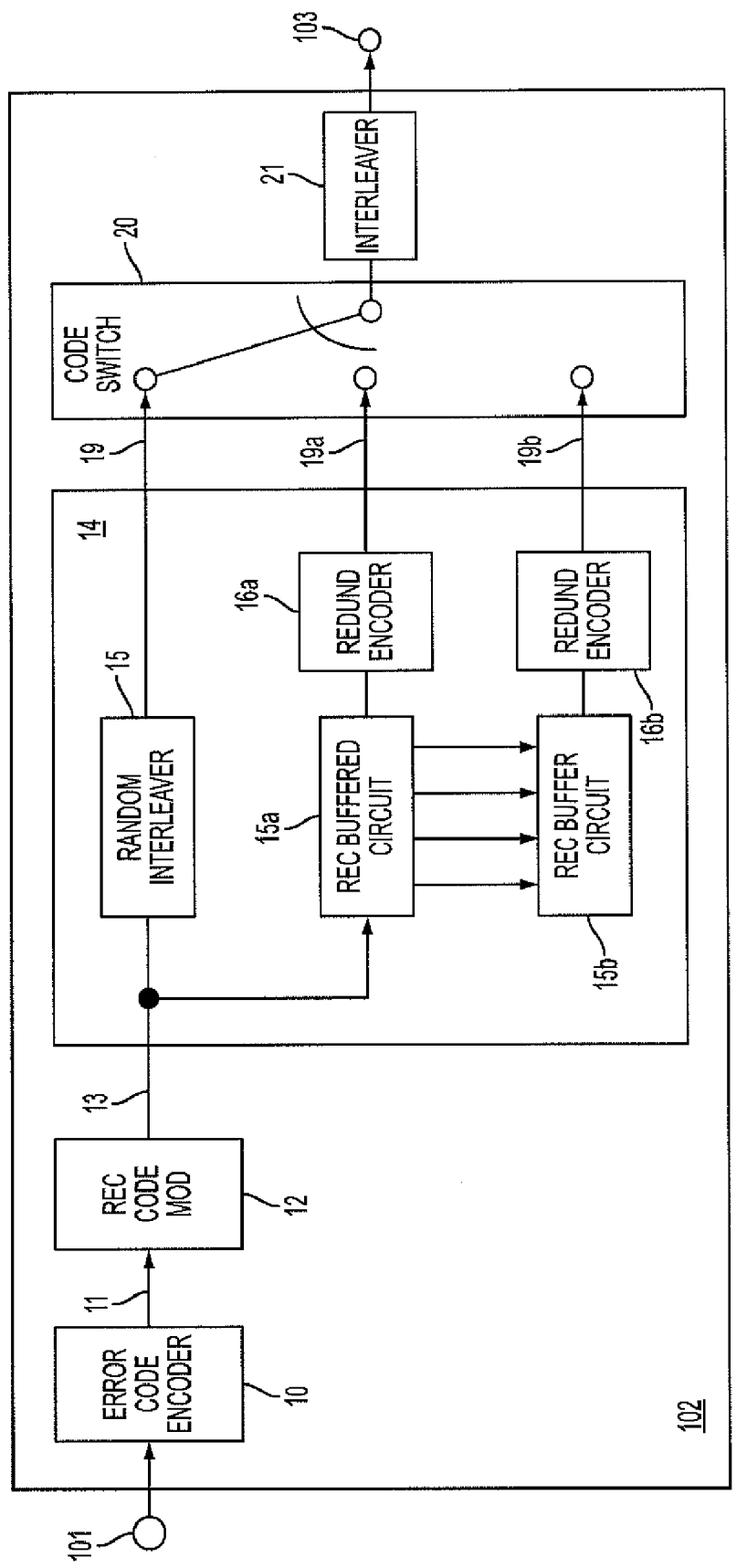
FIG. 8 shows an example of the configuration of a recording encoder (encoding circuit) according to the invention.

FIG. 8 shows an example of a recording encoder showing the permutation of a recording code sequence according to the invention at this time and an interleaver 21 for executing code permutation processing reverse to the interleaver 316a is provided before the output terminal of a recording code sequence 103 and the recording code bits are recorded in the order of permuted codes. In case the interleaver 316a is provided to the encoder 302 in the embodiment shown in FIG. 10, with such prior permuting for the recording code sequence, error correction in parity decoding in the inside of the dotted line at the succeeding stage can be executed by the above-mentioned method.

Twelfth Embodiment

Figure 9:
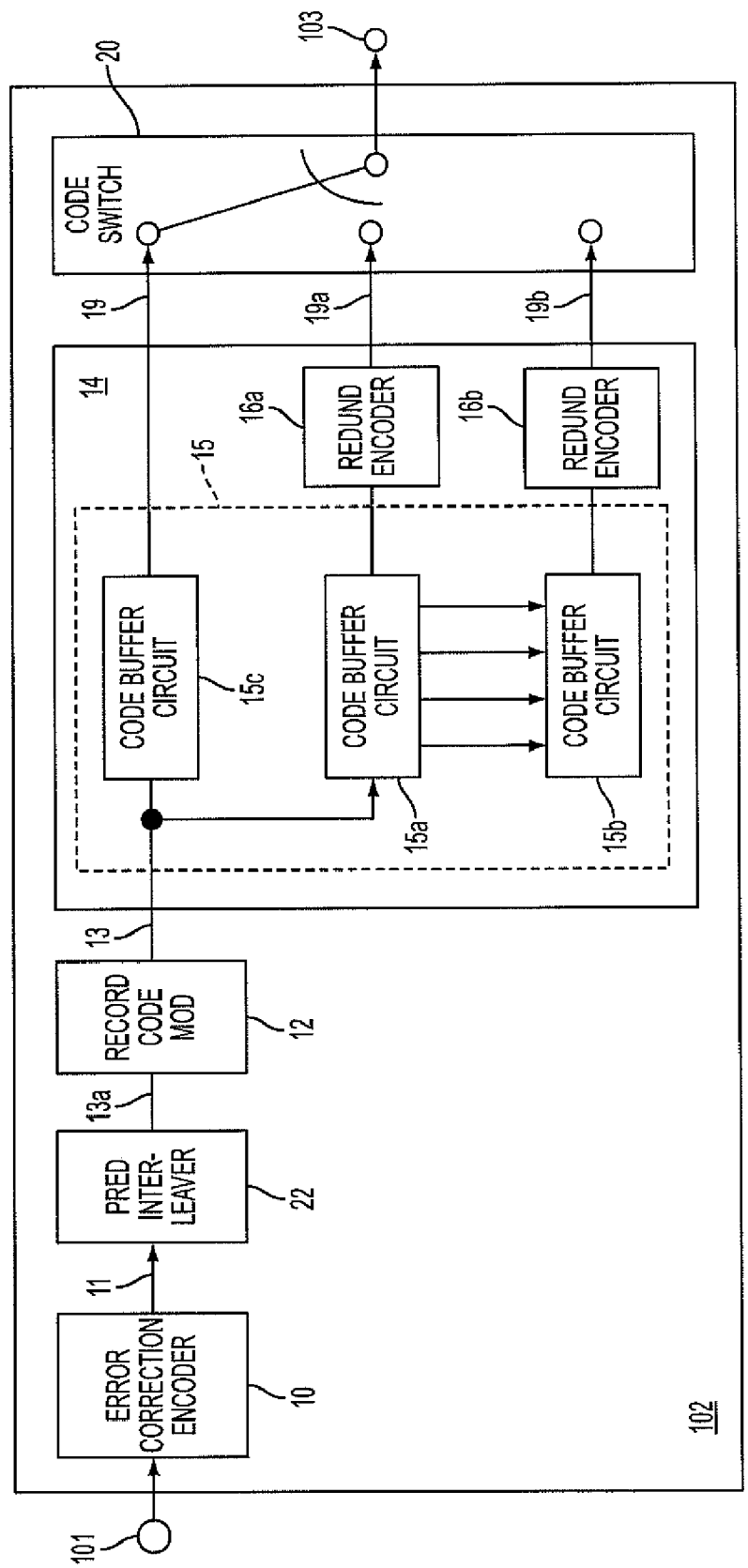
FIG. 9 shows an example of another configuration of the recording encoder (encoding circuit) according to the invention.

FIG. 9 shows another example of processing for permuting a recording code sequence according to the invention and shows an example of the configuration of a recording encoder that applies code permutation to a recording modulated code sequence 13 and a recording code sequence before being input to a concatenated encoder 14 by a predetermined interleaver 22 to prevent violating code constraint by the interleaver 21 and produces the similar effect to that in the eleventh embodiment shown in FIG. 8. By this equivalent code permutation, the interleave 316a can be also omitted on the side of the decoder 302 and a problem of error propagation in iterative decoding can be avoided. For second iterative decoding, the possibility of the deterioration of reliability due to the above-mentioned error propagation can be reduced by using second iterative decoding only in case error correction 37 by first error-correction coding cannot correct all code errors.

Hereby, in the interleaver 22 shown in FIGS. 9 and 8, to enhance the effect of the second iterative decoding, it is desirable that the unit (interleaver size) of code permutation is set to as a large size as possible. For the unit (interleaver size) plural code block sizes or length equivalent to information data sector length can be selected. Under such a condition, the configuration of the encoder equivalent to the embodiment shown in FIG. 9 is characterized in that after code permutation is applied to a code sequence to which first code error-correction coding is applied, the second error-correction coding is executed.

In FIGS. 8 to 10, the embodiments are described using the concrete examples in which plural parity coding are used in every unit of code block shown in FIG. 3, however, the invention can be also easily applied to a case that single error-correction coding (parity coding) is used in each code block.

Thirteenth Embodiment

Figure 11:
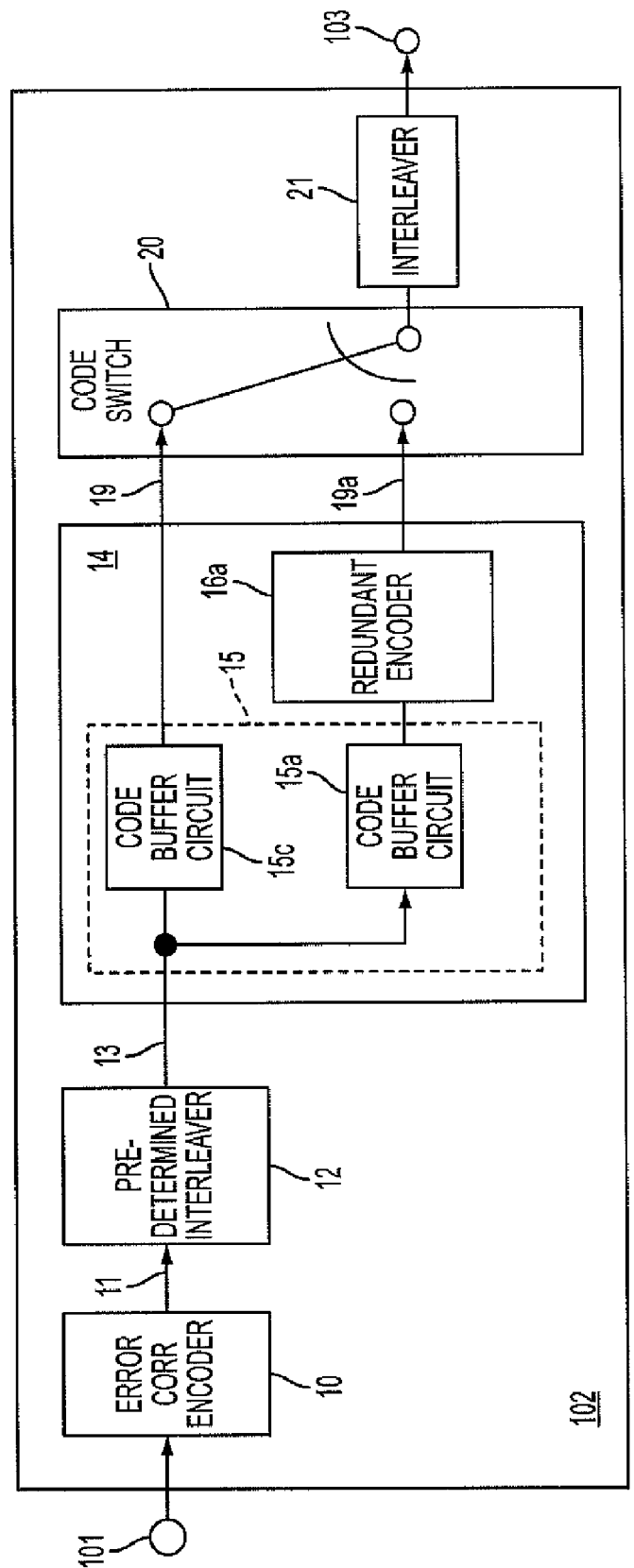
FIG. 11 shows an example of further another configuration of the recording encoder (encoding circuit) according to the invention.
Figure 12:
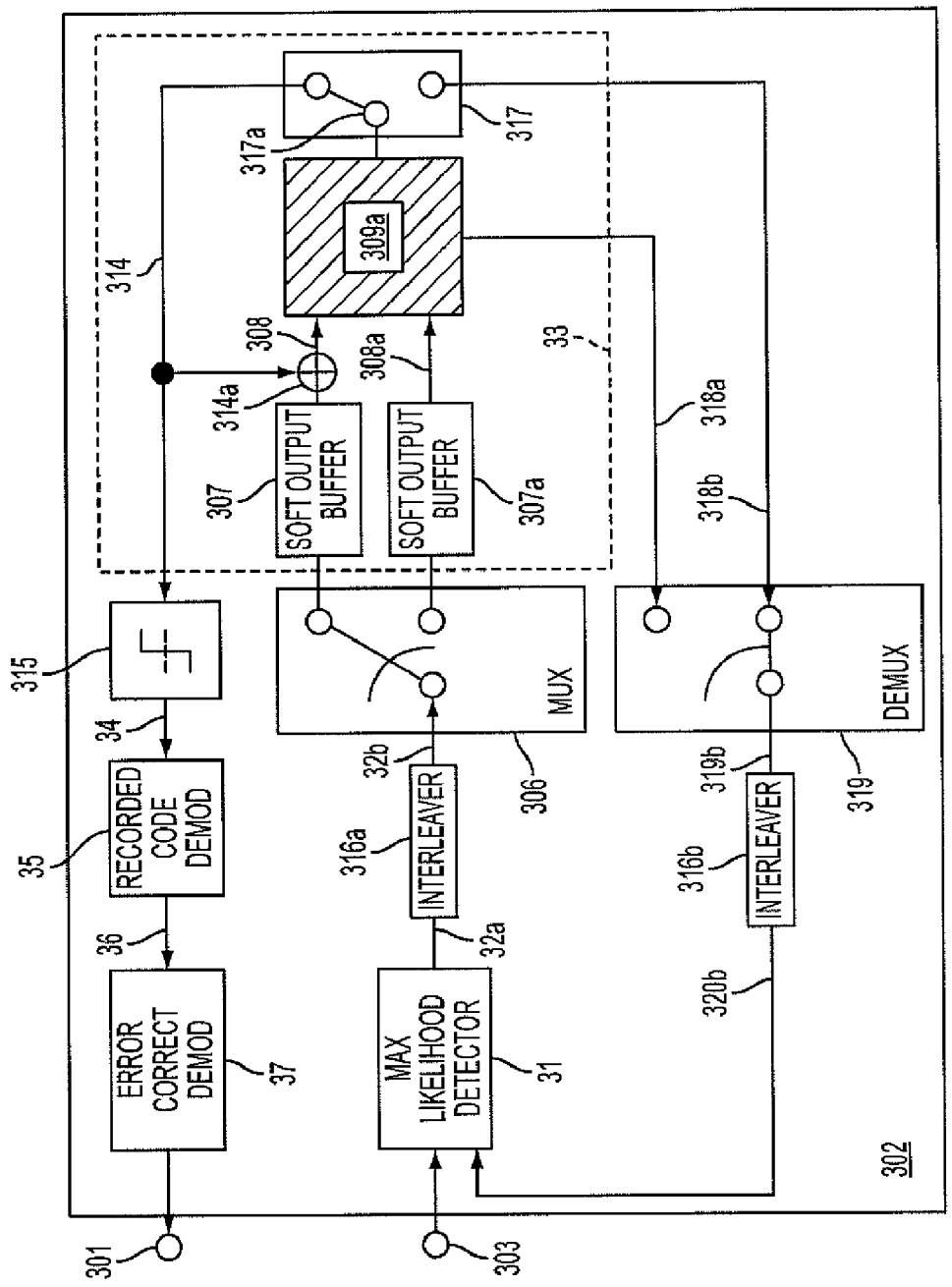
FIG. 12 shows an example of further another configuration of the error-correction decoder (the error-correction encoding circuit in decoding) according to the invention.

FIG. 11 shows an example of a recording encoder in case single parity coding is applied to each code block and the recording encoder is similarly operated corresponding to that equivalent to the eleventh embodiment shown in FIG. 8 (It similarly corresponds to that equivalent to the twelfth embodiment shown in FIG. 9). In a thirteenth embodiment, a single code buffer circuit 15a and a single redundant encoder 16a are provided and a redundant code by single parity coding is inserted into each code block shown in FIGS. 3 and 14. FIG. 12 shows the configuration of a decoder 302 corresponding to the encoder 102 and a single parity decoder 309a is provided in this decoder 302. Iterative decoding at this time is mainly executed by the above-mentioned second iterative decoding. Therefore, a soft-output block information sequence 310 updated in the parity decoder 309a is feedback to a maximum-likelihood detector 31 via a switch 317 and a demultiplexer 319 in iterative decoding and is iteratively processed as described above. After the iteration by a predetermined frequency (iteration time), the soft-output block information sequence 310 is supplied to a level detector 35 according to an instruction signal 317a and is output as the result of decoding. In the case of the iteration in such single parity decoding, the similar effect of correcting both a random code error event and a burst error event to that in the above-mentioned embodiments can be expected by limiting the unit size of code permutation in a code buffer circuit 15a and an interleaver 316a to the unit of a code block described in relation to FIGS. 3 and 14.

As described in this thirteenth embodiment and the tenth embodiment shown in FIG. 10, one of the features of an information recording/reproducing coding method and an information recording/reproducing encoding circuit according to the invention is in that soft-output decoding information for each code bit is regenerated using soft-output decoding information for each code bit acquired after decoding by second error-correction coding in the detection and correction for a code error in each information data sector together with a reproduced signal sequence from the recording medium, and error correction by the second error-correction coding is repeated using this regenerated soft-output decoding information. A coding method corresponding to this decoding is characterized in that after predetermined code permutation processing (in most cases, in a unit (permutation block size) equivalent to length of a recording information data sector) is applied to a code sequence to which first error-correction coding is applied, second error-correction coding is applied.

Besides, the information recording encoding/decoding circuit according to the invention is characterized in that a code permutation circuit that holds and permutes an output code acquired by adding a redundant code to an output code sequence from an encoding circuit which applies first error-correction coding, is provided, processing by the second error-correction encoding circuit is applied to a code sequence output from the code permutation circuit, a reproduced signal sequence supplied from the recording medium is input to a circuit for detecting and correcting a code error in an information code sequence, a maximum-likelihood decoder to which the information of soft-output decoding for each code bit supplied from the error correcting circuit by second error-correction coding is input is provided, soft-output decoding information by second error correction is input again, the soft-output decoding of each code bit is executed by a predetermined frequency (iteration number) and code correction processing by the second error-correction coding is repeated.

As described above, as the iterative decoding in the invention is executed in iteration units of information data sector, decoding delay time (latency) often comes into practical issue when this embodiment is applied to a realistic information recording apparatus. As in the invention, an error-correction demodulator 37 by hard decision for first error-correction coding such as a Reed-Solomon code together with the iterative decoding is provided, a data recovery method is enable, in which the second iterative decoding only in case a code error is detected in the first error-correction coding and all code errors cannot be corrected (only in a retry operation mode in hard-disk drive). By using this method, the iteration number of code error detection and correction (first iterative decoding) by first error-correction coding or the iteration number of code error detection and correction by second error-correction coding can be also reduced to a necessary and minimum number of iteration. This is an effective method for reducing power consumption and data access time in the circuit or the recording/reproduction apparatus to which the invention is applied. Then the circuit for embodying the method is available.

Besides, in case an integrated circuit is mounted for such an information recording encoding circuit, an iterative frequency or the maximum iterative frequency of detecting and correcting a code error by the first error-correction coding or by the second error-correction coding is set from the outside of the information recording encoding circuit. One of features of the integrated circuit mounted in the invention is in that a memory circuit or a register for setting and holding the iterative frequency and an interface for setting the iterative frequency to the memory circuit is/are provided. This is required to specify the maximum decoding delay time (latency) of the information reproducing circuit for a host recording/reproducing controller.

The information recording/reproducing circuit provided by the invention can be mounted on a large-scale integrated circuit (LSI) in the above-mentioned embodiment. In addition, this small-sized LSI component can be easily applied to an information recording/reproduction apparatus for which high speed and high density are required such as a magnetic hard disk drive unit.

Fourteenth Embodiment

Figure 13:
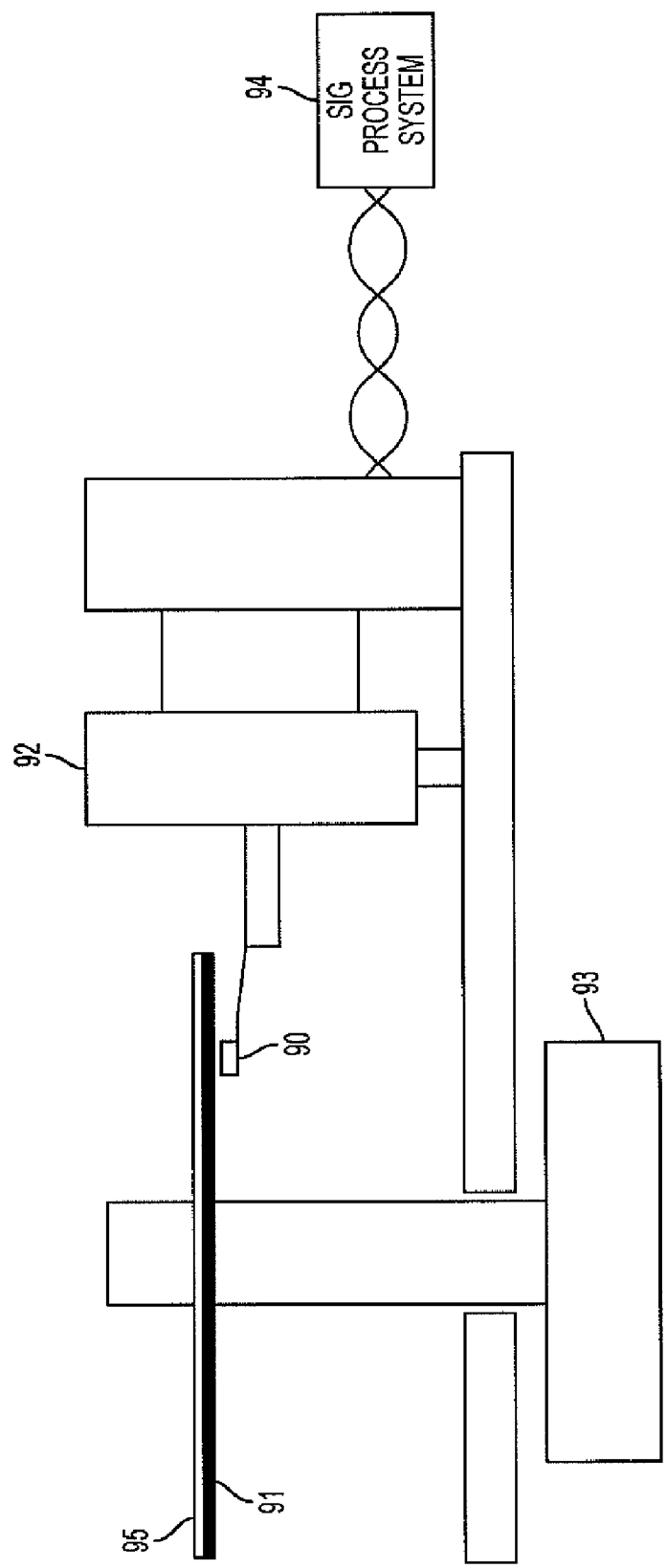
FIG. 13 shows an example of the configuration of the magnetic recording/reproduction apparatus according to the invention.

FIG. 13 shows an example of the configuration of a magnetic recording/reproduction apparatus according to the invention. A magnetic disk recording medium 95 in which a recording layer 91 for magnetically recording information is formed on a substrate is turned by a spindle motor 93 and a magnetic head slider 90 provided with a magnetic sensor film is guided on a track of the magnetic disk recording medium 95 by an actuator 92. In the magnetic recording/reproduction apparatus, a magnetic recording head and a magnetic reproducing head respectively mounted on the head slider 90 as a magnetic sensor are positioned in a predetermined recording position on the magnetic disk recording medium by the above-mentioned mechanism and the magnetic recording head sequentially writes a signal, relatively being moved or the magnetic reproducing head reads a written signal. A recording signal is recorded on the magnetic disk recording medium 95 by the magnetic recording head via a recording/reproduced signal processing system 94 and in the case of reproduction, the output of the magnetic reproducing head is acquired as a signal via the signal processing system 94. In FIG. 13, one head slider 90 and one magnetic disk recording medium are shown, however, respective plural ones may be also provided. The magnetic disk recording medium 95 may be also provided with the recording layer 91 on both sides. In case information is recorded on both sides, the head slider 90 is arranged on both sides of a disk.

For the recording/reproduced signal processing system of the magnetic recording/reproduction apparatus, the information recording/reproducing encoding circuit according to the invention is mounted. By mounting the information recording/reproducing encoding circuit according to the invention, when signal amplitude loss (dropout) of predetermined code length is (intentionally) added to a reproduced signal sequence supplied from the magnetic disk recording medium or when an iterative frequency set from out of the information recording/reproducing circuit is increased, the time interval since the reproduced signal sequence is input to the circuit until the decoding result of an information code sequence for the corresponding reproduced signal sequence is output from the circuit increases by the increase of an iterative decoding frequency executed in the circuit. Similarly, when the code error detection and correction by first error-correction coding do not function and signal amplitude loss (dropout) of predetermined code length is (intentionally) added to a reproduced signal sequence supplied from the recording medium, a code error caused in the decoding result of an information code sequence is longer than the length of the added signal amplitude loss and is caused in a limited length equal to or shorter than the code sequence block length in case the length of the signal amplitude loss exceeds a certain length equal to or shorter than code sequence block length. Further, the configuration equivalent to the above-mentioned embodiment is also characterized in that the configuration in the above-mentioned embodiment that in the code error detection and correction by first error-correction coding, when a flag showing that an error correction code is impossible is sent out, time interval since a reproduced signal sequence is input to the circuit until the decoding of an information code sequence is output to the circuit for the corresponding reproduced signal sequence increases or the increase of time interval until the decoding result of an information code sequence for the corresponding reproduced signal sequence is output is equal to or shorter than time interval in which the code contents in the whole corresponding information data sector are output.

The above-mentioned characteristics are suitable to apply iterative decoding according to the invention and secure the data reliability reproduced from of a magnetic hard-disk drive unit when the contents of a predetermined recorded information data sector on a medium cannot be completely read out in one reproduction processing in the magnetic disk unit to which the invention is applied, that is, in case rereading in a retry mode is executed. Hereby, the enhancement of both the reproduction reliability of recorded data and the access performance/throughput can be realized in a mass-storage high-density magnetic recording/reproduction apparatus.

An information recording/reproduction apparatus and an information communication device on which the information recording/reproducing encoding circuit according to the invention is mounted can also realize the similar characteristic to the above-mentioned magnetic recording/reproduction apparatus.

Fifteenth Embodiment

It is verified that another embodiment of the invention can realize more powerful and higher-speed error-correction coding to which the principle of Turbo coding is applied by the following each information recording/reproducing method.

The information recording/reproducing coding method is based upon an information recording/reproducing coding method for recording/reproducing an information code sequence onto/from an information recording medium to which error-correction coding for detecting and correcting a code error caused in the information code sequence reproduced from the information recording medium is applied (on the information recording medium) and is characterized in that error correction in units of predetermined code (code symbol units) is executed in the unit (an information data sector) of an information code sequence once recorded on the information recording medium, first error-correction coding in which error code symbols equal to or smaller than a predetermined number of code symbols caused in the corresponding reproduced information data sector are corrected is executed, redundant codes or a redundant code sequence hereby acquired are/is added to the information data sector, the information data sector to which the first error-correction coding is applied is divided into continuous plural code sequence blocks each of which has predetermined length of the code symbols, second error-correction coding is applied to each the code sequence block, redundant codes hereby acquired are inserted to the corresponding code sequence block, the code sequence block to which the second error-correction coding is applied has a code sequence block length in units of code symbol in the first error-correction coding, the code sequence block to which the second error-correction coding is applied has a code sequence block length equal to or shorter than the number of code symbols correctable by the first error-correction coding, and the information code sequence to which the first and the second error-correction coding are applied is recorded on the information recording medium.

Besides, the information recording/reproducing coding method is characterized in that in the second error-correction coding, code permutation processing in a processing unit of code symbol length equal to the above-mentioned code sequence block is applied to a code sequence corresponding to the code sequence block, plural code sequence blocks from a code sequence are generated by the code permutation processing, predetermined error-correction coding is applied to each of the generated plural code sequence blocks and redundant code bits generated by respective error-correction coding are inserted into predetermined positions in the corresponding code sequence block.

The information recording/reproducing coding method is characterized in that in the code error detection and correction by the second error-correction coding, the code error detection and correction using the soft-output information of each code bit generated based upon a reproduced signal sequence from the recording medium is executed, decoding processing for the code error detection and correction is repeated again using the soft-output information generated based upon the reproduced signal sequence and the information of soft-output decoding for each code bit acquired as a result of another decoding for the code error detection and correction corresponding to each error-correction coding applied to each code sequence block and after the above-mentioned processing is repeated by a predetermined frequency, the result is output as the result of the reproduction of the information code sequence.

The information recording/reproducing coding method is characterized in that code permutation processing is executed in a processing unit of information data sector length acquired by adding a redundant code to a code sequence to which the first error-correction coding is applied is executed.

The information recording/reproducing coding method is characterized in that in the second error-correction coding and the detection and correction of a code error for the corresponding information data sector, the information of soft-output decoding for each code bit is regenerated using a reproduced signal sequence from the recording medium and the information of soft-output decoding for each code bit acquired after the decoding processing by the predetermined frequency and the second error-correction coding is repeated using this regenerated information of soft-output decoding.

The information recording/reproducing coding method is characterized in that the code error detection and correction by the first error-correction coding or the code error detection and correction by the second error-correction coding is repeated only in case a code error is detected by the first error-correction coding and all the code errors cannot be corrected.

The information recording/reproducing coding method is characterized in that the information recording medium is a magnetic disk recording medium.

According to the invention, the recording format for information data provided with more powerful and higher-speed error-correction encoding means applying the principle of Turbo coding, the information recording/reproducing coding method and encoding circuit, the magnetic recording/reproduction apparatus using these, the information recording/reproduction apparatus and the information communication device can be provided.

What is claimed is:

1. An information recording/reproducing coding method for recording/reproducing an information code sequence onto/from an information recording medium to which error-correction coding is executed for detecting and correcting a code error caused in the information code sequence reproduced from the information recording medium, comprising:

executing a first error-correction coding for enabling an error correction in units of predetermined code an information data sector of the information code sequence once recorded on the information recording medium, in which error code symbols equal to or smaller than a predetermined number of code symbols caused in the corresponding reproduced information data sector are corrected, and adding a redundant code sequence hereby acquired to the information data sector, dividing the information data sector, to which the first error-correction coding is applied, into continuous plural code sequence blocks, each of which has predetermined length of the code symbols, executing a second error-correction coding for each of the code sequence blocks, and inserting redundant codes hereby acquired into the corresponding code sequence block, and executing code error detection and correction using the redundant code acquired by the second error-correction coding, for executing the code error detection and correction using a soft-output information of each code bit generated based upon a reproduced signal sequence from the recording medium for executing decoding process for the code error detection and correction is repeated again using the soft-output information generated based upon the reproduced signal sequence and the information of soft-output decoding for each code bit acquired as a result of another decoding for the code error detection and correction corresponding to each error-correction coding applied to each of the code sequence blocks, and after the decoding process is repeated by a predetermined number of times, outputting decoded data as a result of the reproduction of the information code sequence.

2. The information recording/reproducing coding method according to claim 1, wherein a code symbol length of the code sequence block is equal to or less than a maximum number of the error code symbols that is corrected by the redundant code sequence.

3. A recording/reproducing signal processing circuit including a recording signal processing system and a reproducing signal processing system, which is utilized for storage recording/reproducing apparatus that reproduces an information code sequence consisting of a plurality of code bits recorded by a predetermined unit in a recording medium, said recording signal processing system comprising:

a first encoding circuit that applies first error-correction code to the information code sequence by the predetermined unit, and adds a first redundant code sequence to said coded information code sequence, thereby generates an error-correction code sequence;

a concatenated encoder that:
 divides the error-correction code sequence output from the first encoding circuit into continuous plural code sequence blocks having predetermined length,
 stores each code sequence block,
 executes second error-correction coding for each code sequence block, and
 generates a second redundant code sequence with referring to the contents of each code sequence block; and
a code switch that outputs the plural code sequence blocks and the second redundant code sequence alternatively, thereby generating the information code sequence comprised of the plural code sequence blocks;

wherein the second redundant code is inserted in each code sequence block; and wherein said recording/reproducing signal processing system comprises:
a maximum-likelihood detector that receives a reproduced signal sequence supplied from the recording medium and outputs a soft-output code information sequence, which is comprised of multi-valued reliability information corresponding to each code bit of the information code sequence;

a multiplexer that divides the soft-output code information sequence into a first soft-output code information corresponding to the information code sequence of the plural code sequence blocks and a second soft-output code information corresponding to the second redundant code inserted in each code sequence block;

a plurality of soft-output buffer that stores the first soft-output code information and the second redundant code;

an iterative detector that executes an error-correction to the first soft-output code information in each code sequence block by using the second soft-output code information, and outputs an error-correction decoded sequence; and an error-correction demodulator that corrects a code error in the error-correction decoded sequence by using the first redundant code.

* * * * *